(12) United States Patent
Tanaka

(10) Patent No.: US 11,024,822 B2
(45) Date of Patent: Jun. 1, 2021

(54) ORGANIC ELECTROLUMINESCENT ELEMENT, LIGHTING DEVICE, AND DISPLAY DEVICE

(71) Applicant: XIANYANG CHVT NEW DISPLAY TECHNOLOGY CO., LTD., Xianyang (CN)

(72) Inventor: Junichi Tanaka, Yonezawa (JP)

(73) Assignee: XIANYANG CHVT NEW DISPLAY TECHNOLOGY CO., LTD., Xianyang (CN)

( * ) Notice: Subject to any disclaimer, the term of this patent is extended or adjusted under 35 U.S.C. 154(b) by 41 days.

(21) Appl. No.: 16/468,995

(22) PCT Filed: Dec. 27, 2017

(86) PCT No.: PCT/JP2017/047102
§ 371 (c)(1),
(2) Date: Jun. 12, 2019

(87) PCT Pub. No.: WO2018/124238
PCT Pub. Date: Jul. 5, 2018

(65) Prior Publication Data
US 2019/0319209 A1 Oct. 17, 2019

(30) Foreign Application Priority Data
Dec. 27, 2016 (JP) .............. JP2016-254302

(51) Int. Cl.
*H01L 51/50* (2006.01)
*H01L 27/32* (2006.01)
(Continued)

(52) U.S. Cl.
CPC .......... *H01L 51/504* (2013.01); *H01L 27/322* (2013.01); *H01L 27/3244* (2013.01);
(Continued)

(58) Field of Classification Search
CPC . H01L 51/504; H01L 27/322; H01L 27/3244; H01L 51/0072; H01L 51/0097;
(Continued)

(56) References Cited

U.S. PATENT DOCUMENTS 7,977,872 B2  7/2011 Spindler et al.
10,084,146 B2  9/2018 Tanaka et al.
(Continued)

FOREIGN PATENT DOCUMENTS

CN  104979482 A  10/2015
JP  2003-272860 A  9/2003
(Continued)

OTHER PUBLICATIONS

International Search Report issued in PCT/JP2017/047102 (PCT/ISA/210), dated Apr. 10, 2018.

*Primary Examiner* — Stephen W Smoot
*Assistant Examiner* — Vicki B. Booker
(74) *Attorney, Agent, or Firm* — WPAT, PC

(57) ABSTRACT

This organic EL element has two blue light emitting units, and has, in the emission spectrum thereof, one or two peak wavelengths in a blue light wavelength range of 440 nm-490 nm. In this organic EL element, the correlated color temperature of white light is 3300K or greater, R6 is 60 or greater, and R12 is 30 or greater.

33 Claims, 14 Drawing Sheets

(51) Int. Cl.
*H01L 51/00* (2006.01)
*H01L 51/52* (2006.01)
*H01L 51/56* (2006.01)

(52) U.S. Cl.
CPC ...... *H01L 51/0072* (2013.01); *H01L 51/0097* (2013.01); *H01L 51/5012* (2013.01); *H01L 51/5016* (2013.01); *H01L 51/524* (2013.01); *H01L 51/5262* (2013.01); *H01L 51/5278* (2013.01); *H01L 51/001* (2013.01); *H01L 51/0021* (2013.01); *H01L 51/5056* (2013.01); *H01L 51/5072* (2013.01); *H01L 51/5206* (2013.01); *H01L 51/5221* (2013.01); *H01L 51/56* (2013.01); *H01L 2251/5338* (2013.01); *H01L 2251/558* (2013.01)

(58) Field of Classification Search
CPC ............. H01L 51/5012; H01L 51/5016; H01L 51/524; H01L 51/5262; H01L 51/5278; H01L 51/001; H01L 51/0021; H01L 51/5056; H01L 51/5072; H01L 51/5206; H01L 51/5221; H01L 51/56; H01L 2251/5338; H01L 2251/558; H01L 51/5275; H01L 2251/5376; Y02E 10/549; H05B 33/02; H05B 33/04; H05B 33/12; G02B 5/20; G09F 9/30
See application file for complete search history.

(56) References Cited

U.S. PATENT DOCUMENTS

| | | |
|---|---|---|
| 10,217,967 B2 | 2/2019 | Kido et al. |
| 2012/0007024 A1* | 1/2012 | Schols ............... H01L 51/5028 252/301.16 |
| 2012/0236016 A1 | 9/2012 | Fujino |
| 2012/0248971 A1 | 10/2012 | Okuyama |
| 2015/0207091 A1 | 7/2015 | Morimoto et al. |
| 2015/0287949 A1 | 10/2015 | Okamoto et al. |
| 2016/0190500 A1 | 6/2016 | Watabe et al. |
| 2019/0148676 A1 | 5/2019 | Morimoto et al. |

FOREIGN PATENT DOCUMENTS

| | | |
|---|---|---|
| JP | 2009-224274 A | 10/2009 |
| JP | 2012-503294 A | 2/2012 |
| JP | 2012-194256 A | 10/2012 |
| JP | 2012-227118 A | 11/2012 |
| JP | 2014-11208 A | 1/2014 |
| JP | 2015-201508 A | 11/2015 |
| JP | 2016-127287 A | 7/2016 |
| JP | 2016-167441 A | 9/2016 |
| JP | 5991686 B1 | 9/2016 |
| JP | 5991686 B1 | 9/2016 |

* cited by examiner

FIG.14

| CATHODE 100nm |
|---|
| ELECTRON TRANSPORT LAYER 72nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 35nm |
| CHARGE GENERATING LAYER 6nm |
| ELECTRON TRANSPORT LAYER 15nm |
| BLUE FLUORESCENT LIGHT EMITTING LAYER 25nm 5% |
| HOLE TRANSPORT LAYER 45nm |
| CHARGE GENERATING LAYER 6nm |
| ELECTRON TRANSPORT LAYER 15nm |
| BLUE FLUORESCENT LIGHT EMITTING LAYER 25nm 5% |
| HOLE TRANSPORT LAYER 75nm |
| ANODE 100nm |

FIG.16

| |
|---|
| CATHODE 100nm |
| ELECTRON TRANSPORT LAYER 68nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 35nm |
| CHARGE GENERATING LAYER 6nm |
| ELECTRON TRANSPORT LAYER 15nm |
| BLUE FLUORESCENT LIGHT EMITTING LAYER 25nm 5% |
| HOLE TRANSPORT LAYER 45nm |
| CHARGE GENERATING LAYER 6nm |
| ELECTRON TRANSPORT LAYER 15nm |
| BLUE FLUORESCENT LIGHT EMITTING LAYER 25nm 5% |
| HOLE TRANSPORT LAYER 55nm |
| ANODE 100nm | ered to as "organic EL element" for short) is a self-
ORGANIC ELECTROLUMINESCENT ELEMENT, LIGHTING DEVICE, AND DISPLAY DEVICE

TECHNICAL FIELD

The present invention relates to an organic electroluminescent element and to a display device and a lighting device including the same.

The present application claims the benefit of priority of Japanese Patent Application No. 2016-254302 filed on Dec. 27, 2016, the contents of which are incorporated herein by reference.

BACKGROUND ART

An organic electroluminescent element (hereafter, also referred to as "organic EL element" for short) is a self-luminescent element including a light emitting layer, made of an organic compound, between a cathode and an anode facing each other. When voltage is applied between the cathode and the anode, electrons injected into the light emitting layer from the cathode side and holes injected into the light emitting layer from the anode side recombine in the light emitting layer to form excitons and the excitons causes the organic EL element to emit light.

As an organic EL element capable of achieving high luminance and long lifetime, there is known an element with a multi-photon emission structure (hereafter, referred to as "MPE element" for short) in which a light emitting unit including at least one light emitting layer is considered as one unit and an electrically-insulating charge generating layer is arranged between multiple light emitting units (for example, see Patent Document 1). In the MPE element, when voltage is applied between a cathode and an anode, charges in a charge transfer complex move to the cathode side and the anode side. In the MPE element, holes are thereby injected into one light emitting unit located on the cathode side of the charge generating layer and electrons are injected into another light emitting unit located on the anode side of the charge generating layer. In such an MPE element, since light can be simultaneously emitted from the multiple light emitting units with the same current amount, a current efficiency and an external quantum efficiency multiplied by the number of the light emitting units can be achieved.

Moreover, the MPE element can provide white light by combining various light emitting units configured to emit light of different colors. Accordingly, in recent years, there are developed MPE elements aimed to be applied to a display device and a lighting device which basically emit white light. For example, there is known an MPE element suitable for a display device which generates white light with high color temperature at high efficiency by using a combination of a light emitting unit configured to emit blue light and a light emitting unit configured to emit green light and yellow light (for example, see Patent Document 2). Moreover, there is known an MPE element suitable for a lighting device which generates white light with high color temperature and an excellent color rendering property by using a combination of a light emitting unit configured to emit red light and a light emitting unit configured to emit blue light and yellow light (for example, see Patent Document 3).

Although the display device and the lighting device both use white light, required performance specifications vary between these devices and MPE elements with structures dedicated to the respective devices have been developed. For example, as described in Patent Documents 2 and 3, in the development of MPE elements characterized by emission of white light with high color temperature, luminous efficiency is focused on in the development of the MPE element for the display device while a color rendering property is focused on in the development of the MPE element for the lighting device.

However, from the viewpoint of obtaining excellent white light, it is ideal in both of the display device and the lighting device that the element can provide white light which is excellent not only in some of the characteristics but also in all three important indices of white light, that is color temperature, luminous efficiency, and a color rendering property in a balanced manner.

PRIOR ART DOCUMENT

Patent Document

Patent Document 1: Japanese Patent Application Publication No. 2003-272860
Patent Document 2: Published Japanese Translation of PCT International Application No. 2012-503294
Patent Document 3: Japanese Patent Application Publication No. 2009-224274

SUMMARY OF THE INVENTION

Problems to be Solved by the Invention

The present invention has been proposed in view of the aforementioned conventional circumstances and an object thereof is to provide an organic electroluminescent element which can provide white light with high color temperature, high luminous efficiency, and an excellent color rendering property and is thus suitable for both of a display device and a lighting device and to provide a display device and a lighting device including this organic electroluminescent element.

Means for Solving the Problems

To achieve the above object, provided are the following aspects.
(1) An organic electroluminescent element having a structure in which a plurality of light emitting units each including a light emitting layer made of at least an organic compound are stacked one on top of another between a first electrode and an second electrode with a charge generating layer sandwiched between each pair of the adjacent light emitting units, characterized in that
the organic electroluminescent element comprises at least two blue light emitting units each including a light emitting layer formed of a blue light emitting layer which emits blue light with one or two peak wavelengths in a blue wavelength band,
white light produced by light emission of the plurality of light emitting units has an emission spectrum continuous over a wavelength band of at least 380 nm to 780 nm and has one or two peak wavelengths in a blue wavelength band of 440 nm to 490 nm in the emission spectrum,
correlated color temperature of the white light is 3300 K or higher, and
R6 and R12 among special color rendering indices (Ri) of the white light are 60 or more and 30 or more, respectively.

(2) The organic electroluminescent element according to the above aspect (1), characterized in that R12 among the special color rendering indices (Ri) of the white light is 60 or more.
(3) The organic electroluminescent element according to the above aspect (1) or (2), characterized in that the blue light emitting layer is formed of a blue fluorescent light emitting layer containing a blue fluorescent material.
(4) The organic electroluminescent element according to the above aspect (3), characterized in that the blue light provided by the blue light emitting unit including the blue fluorescent light emitting layer includes a delayed fluorescence component.
(5) The organic electroluminescent element according to the above aspect (1) or (2), characterized in that the blue light emitting layer is formed of a blue phosphorescent light emitting layer containing a blue phosphorescent material.
(6) The organic electroluminescent element according to anyone of the above aspects (1) to (5), characterized in that
the organic electroluminescent element comprises two of the blue light emitting units which are identical, and
the blue light emitting units emit blue light with the same peak wavelength.
(7) The organic electroluminescent element according to anyone of the above aspects (1) to (5), characterized in that
the organic electroluminescent element comprises two of the blue light emitting units which are different from each other, and
the blue light emitting units emit blue light with different peak wavelengths, respectively.
(8) The organic electroluminescent element according to the above aspect (7), characterized in that the white light has one peak wavelength in a blue wavelength band of 440 nm to 470 nm and one peak wavelength in a blue wavelength band of 470 nm to 490 nm.
(9) The organic electroluminescent element according to anyone of the above aspects (1) to (8), characterized in that
the organic electroluminescent element comprises at least one red/green light emitting unit including a light emitting layer formed by stacking a red phosphorescent light emitting layer which emits red light with one peak wavelength in a red wavelength band and a green phosphorescent light emitting layer which emits green light with one or two peak wavelengths in a green wavelength band one on top of the other, and
the white light produced by the light emission of the plurality of units has one peak wavelength in a red wavelength band of 590 nm to 640 nm and one or two peak wavelengths in a green wavelength band of 500 nm to 560 nm.
(10) The organic electroluminescent element according to any one of the above aspects (1) to (8), characterized in that
the organic electroluminescent element comprises at least one red-green light emitting unit including a light emitting layer formed of a mixed layer of a red phosphorescent material and a green phosphorescent material, and
the white light produced by the light emission of the plurality of light emitting units has one peak wavelength in a red wavelength band of 590 nm to 640 nm and one or two peak wavelengths in a green wavelength band of 500 nm to 560 nm.
(11) The organic electroluminescent element according to any one of the above aspects (1) to (10), characterized in that a light emission intensity of the peak wavelength in the blue wavelength band of 440 nm to 490 nm is higher than either of a light emission intensity of the peak wavelength in the red wavelength band of 590 nm to 640 nm and a light emission intensity of the peak wavelength in the green wavelength band of 500 nm to 560 nm.

(12) The organic electroluminescent element according to the above aspect (11), characterized in that the white light has one bottom wavelength in a blue wavelength band and a green wavelength band of 500 nm to 520 nm.
(13) The organic electroluminescent element according to the above aspect (12), characterized in that a light emission intensity of the one bottom wavelength in the blue wavelength band and the green wavelength band of 500 nm to 520 nm is lower than a light emission intensity of a bottom wavelength in a wavelength band of 570 nm to 590 nm.
(14) The organic electroluminescent element according to the above aspect (12) or (13), characterized in that a ratio of (B) to (A) ((B)/(A)) is 0.50 or smaller, where (A) is a light emission intensity of a peak wavelength having the highest light emission intensity in the wavelength band of 380 nm to 780 nm and (B) is a light emission intensity of the one bottom wavelength in the blue wavelength band and the green wavelength band of 500 nm to 520 nm.
(15) The organic electroluminescent element according to any one of the above aspects (1) to (14), characterized in that an average color rendering index (Ra) of the white light is 70 or more.
(16) The organic electroluminescent element according to any one of the above aspects (9) to (15), the organic electroluminescent element having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent element capable of providing the white light by causing the plurality of light emitting units to emit light, characterized in that
the organic electroluminescent element comprises:
a first light emitting unit formed of the red/green light emitting unit or the red-green light emitting unit;
a second light emitting unit formed of the blue light emitting unit; and
a third light emitting unit formed of the blue light emitting unit,
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent element has a structure in which the second electrode, the third light emitting unit, the second charge generating layer, the second light emitting unit, the first charge generating layer, the first light emitting unit, and the first electrode are stacked one on top of another in this order.
(17) The organic electroluminescent element according to any one of the above aspects (9) to (15), the organic electroluminescent element having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent element capable of providing the white light by causing the plurality of light emitting units to emit light, characterized in that
the organic electroluminescent element comprises:
a first light emitting unit formed of the blue light emitting unit;

a second light emitting unit formed of the red/green light emitting unit or the red-green light emitting unit; and
a third light emitting unit formed of the blue light emitting unit,
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent element has a structure in which the second electrode, the third light emitting unit, the second charge generating layer, the second light emitting unit, the first charge generating layer, the first light emitting unit, and the first electrode are stacked one on top of another in this order.

(18) The organic electroluminescent element according to any one of the above aspects (9) to (15), the organic electroluminescent element having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent element capable of providing the white light by causing the plurality of light emitting units to emit light, characterized in that
the organic electroluminescent element comprises:
a first light emitting unit formed of the red/green light emitting unit or the red-green light emitting unit;
a second light emitting unit formed of the blue light emitting unit;
a third light emitting unit formed of the red/green light emitting unit or the red-green light emitting unit; and
a fourth light emitting unit formed of the blue light emitting unit,
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween,
the third light emitting unit and the fourth light emitting unit are stacked one on top of the other with a third charge generating layer sandwiched therebetween, and
the organic electroluminescent element has a structure in which the second electrode, the fourth light emitting unit, the third charge generating layer, the third light emitting unit, the second charge generating layer, the second light emitting unit, the first charge generating layer, the first light emitting unit, and the first electrode are stacked one on top of another in this order.

(19) The organic electroluminescent element according to any one of the above aspects (9) to (15), the organic electroluminescent element having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent element capable of providing the white light by causing the plurality of light emitting units to emit light, characterized in that
the organic electroluminescent element comprises:
a first light emitting unit formed of the red/green light emitting unit or the red-green light emitting unit;
a second light emitting unit formed of the blue light emitting unit;
a third light emitting unit formed of the red/green light emitting unit or the red-green light emitting unit;
a fourth light emitting unit formed of the red/green light emitting unit or the red-green light emitting unit;
a fifth light emitting unit formed of the blue light emitting unit; and
a sixth light emitting unit formed of the red/green light emitting unit or the red-green light emitting unit,
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween,
the third light emitting unit and the fourth light emitting unit are stacked one on top of the other with a third charge generating layer sandwiched therebetween,
the fourth light emitting unit and the fifth light emitting unit are stacked one on top of the other with a fourth charge generating layer sandwiched therebetween,
the fifth light emitting unit and the sixth light emitting unit are stacked one on top of the other with a fifth charge generating layer sandwiched therebetween, and
the organic electroluminescent element has a structure in which the second electrode, the sixth light emitting unit, the fifth charge generating layer, the fifth light emitting unit, the fourth charge generating layer, the fourth light emitting unit, the third charge generating layer, the third light emitting unit, the second charge generating layer, the second light emitting unit, the first charge generating layer, the first light emitting unit, and the first electrode are stacked one on top of another in this order.

(20) The organic electroluminescent element according to any one of the above aspects (1) to (19), characterized in that
the charge generating layers are formed of electrically insulating layers made of an electron accepting material and an electron donating material, and
a specific resistance of the electrically insulating layers is $1.0 \times 10^2 \Omega \cdot cm$ or more.

(21) The organic electroluminescent element according to the above aspect (20), characterized in that the specific resistance of the electrically insulating layers is $1.0 \times 10^5 \Omega \cdot cm$ or more.

(22) The organic electroluminescent element according to any one of the above aspects (1) to (19), characterized in that
each of the charge generating layers is formed of a mixed layer of different materials and one component of the mixed layer forms a charge transfer complex by redox, and
when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

(23) The organic electroluminescent element according to any one of the above aspects (1) to (19), characterized in that
each of the charge generating layers is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

(24) The organic electroluminescent element according to any one of the above aspects (1) to (23), characterized in that the charge generating layers contain a compound having a structure expressed by formula (1):

[Chem. 1]

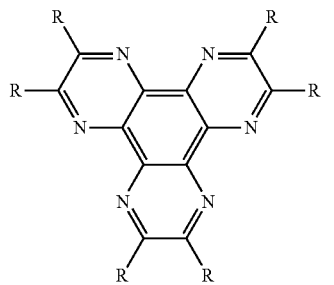

(1)

where R represents an electron withdrawing group of F, Cl, Br, I, CN, or $CF_3$.

(25) The organic electroluminescent element according to any one of the above aspects (1) to (24), characterized in that the organic electroluminescent element comprises at least three color filters different from one another, and an arrangement of the at least three color filters different from one another changes the white light produced by the light emission of the plurality of light emitting units to light of a different color.

(26) The organic electroluminescent element according to the above aspect (25), characterized in that the arrangement of the at least three color filters different from one another is one selected from the group consisting of a stripe arrangement, a mosaic arrangement, a delta arrangement, and a pentile arrangement.

(27) The organic electroluminescent element according to the above aspect (25) or (26), characterized in that the at least three color filters different from one another are a red color filter, a green color filter, and a blue color filter, and the organic electroluminescent element has a RGB arrangement in which the three color filters different from one another are arranged in turn.

(28) The organic electroluminescent element according to the above aspect (27), characterized in that the organic electroluminescent element has a RGBW arrangement including the RGB arrangement, and the color filters are not arranged in an arrangement portion of W.

(29) The organic electroluminescent element according to the above aspect (28), characterized in that the RGBW arrangement is one selected from the group consisting of a stripe arrangement, a mosaic arrangement, a delta arrangement, and a pentile arrangement.

(30) A display device characterized in that the display device comprises the organic electroluminescent element according to any one of the above aspects (25) to (29).

(31) The display device according to the above aspect (30), characterized in that the display device comprises a base substrate and a sealing substrate which are formed of flexible substrates, and the display device is flexible.

(32) A lighting device characterized in that the lighting device comprises the organic electroluminescent element according to any one of the above aspects (1) to (24).

(33) The lighting device according to the above aspect (32), characterized in that the lighting device comprises an optical film on a light extraction surface side of the organic electroluminescent element.

(34) The lighting device according to the above aspect (32) or (33), characterized in that an average color rendering index (Ra) of the white light is 80 or more.

(35) The lighting device according to the above aspect (34), characterized in that the lighting device comprises a base substrate and a sealing substrate which are formed of flexible substrates, and the lighting device is flexible.

Effect of the Invention

According to one aspect described above, it is possible to provide an organic electroluminescent element which can provide white light with high color temperature, high luminous efficiency, and an excellent color rendering property and is thus suitable for both of a display device and a lighting device and to provide a display device and a lighting device including this organic electroluminescent element.

BRIEF DESCRIPTION OF THE DRAWINGS

FIG. 14 is a cross-sectional view illustrating an element structure of an organic EL element in Example 1.

FIG. 16 is a cross-sectional view illustrating an element structure of an organic EL element in Example 2.

MODE FOR CARRYING OUT THE INVENTION

Figure 1:
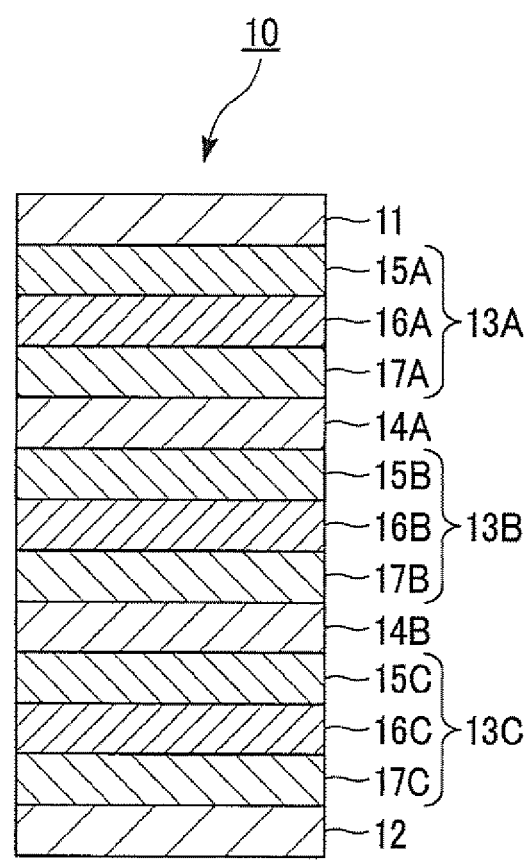
FIG. 1 is a cross-sectional view illustrating a schematic configuration of a first embodiment of an organic EL element in the present invention.

Detailed description is given of embodiments of an organic electroluminescent element of the present invention and a display device and a lighting device including the same with reference to the drawings.

Note that, for the sake of convenience, in the drawings used in the following description, characteristic parts are sometimes illustrated in an enlarged manner to facilitate understanding of characteristics, and proportions of dimensions of constitutional elements and the like are not always the same as actual ones. Moreover, materials, dimensions, and the like exemplified in the following description are merely examples and the present invention are not necessarily limited to those and can be carried out with the materials, dimensions, and the like appropriately changed within a scope not changing the spirit of the invention.

[Organic Electroluminescent Element (Organic EL Element)]

First Embodiment

FIG. 1 is a cross-sectional view illustrating a schematic configuration of a first embodiment of the organic EL element in the present invention.

As illustrated in FIG. 1, the organic EL element 10 of the embodiment has a structure in which multiple light emitting units 13A, 13B, 13C each including a light emitting layer made of at least an organic compound are stacked one on top of another between a first electrode 11 and a second electrode 12 with each of charge generating layers (CGL) 14A, 14B sandwiched between a corresponding pair of the adjacent light emitting units. The organic EL element 10 is an organic EL element capable of providing white light by causing the multiple light emitting units 13A, 13B, 13C to emit light.

The organic EL element 10 of the embodiment includes the first light emitting unit 13A, the second light emitting unit 13B, and the third light emitting unit 13C.

The first light emitting unit 13A is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The second light emitting unit 13B is a blue light emitting unit. The blue light emitting unit includes a light emitting layer formed of a blue light emitting layer which emits blue light with one or two peak wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The third light emitting unit 13C is a blue light emitting unit. The blue light emitting unit includes a light emitting layer formed of a blue light emitting layer which emits blue light with one or two peak wavelengths in the blue wavelength band. The blue light emitting layer may be either a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The first light emitting unit 13A and the second light emitting unit 13B are stacked one on top of the other with the first charge generating layer 14A sandwiched therebetween.

The second light emitting unit 13B and the third light emitting unit 13C are stacked one on top of the other with the second charge generating layer 14B sandwiched therebetween.

The organic EL element 10 of the embodiment has a structure in which the second electrode 12, the third light emitting unit 13C, the second charge generating layer 14B, the second light emitting unit 13B, the first charge generating layer 14A, the first light emitting unit 13A, and the first electrode 11 are stacked one on top of another in this order. Specifically, the organic EL element 10 of the embodiment has an MPE structure in which the first light emitting unit 13A, the second light emitting unit 13B, and the third light emitting unit 13C are stacked one on top of another with each of the first charge generating layer 14A and the second charge generating layer 14B sandwiched between the corresponding pair of adjacent light emitting units.

In the organic EL element 10 of the embodiment, the white light produced by light emission of the first light emitting unit 13A, the second light emitting unit 13B, and the third light emitting unit 13C has an emission spectrum continuous over a wavelength band of at least 380 nm to 780 nm. Moreover, in the organic EL element 10 of the embodiment, the white light has one or two peak wavelengths in the blue wavelength band of 440 nm to 490 nm in this emission spectrum. Furthermore, in the organic EL element 10 of the embodiment, the white light has one peak wavelength in the red wavelength band of 590 nm to 640 nm and one or two peak wavelengths in the green wavelength band of 500 nm to 560 nm in this emission spectrum.

Generally, a metal with a small work function, an alloy of such a metal, a metal oxide, or the like is preferably used as the first electrode 11. For example, as a metal forming the first electrode 11, it is possible to use a metal single substance like an alkaline metal such as lithium (Li), an alkaline earth metal such as magnesium (Mg) or calcium (Ca), or a rare-earth metal such as europium (Eu) or use an alloy containing any of these metals and aluminum (Al), silver (Ag), indium (In), or the like.

Alternatively, the first electrode 11 may have a configuration in which an organic layer doped with a metal is used in an interface between the first electrode 11 and an organic layer as described in, for example, "Japanese Patent Application Publication No. Hei 10-270171" and "Japanese Patent Application Publication No. 2001-102175." In this case, it is only necessary to use an electrically conductive material as the material of the first electrode 11 and the material is not limited to one with particular properties such as the work function.

As another alternative, the first electrode 11 may have a configuration in which an organic layer in contact with the first electrode 11 is made of an organic metal complex compound containing at least one type selected from the group consisting of alkali metal ions, alkaline earth metal ions, and rare-earth metal ions as described in, for example, "Japanese Patent Application Publication No. Hei 11-233262" and "Japanese Patent Application Publication No. 2000-182774." In this case, a metal capable of reducing the metal ions contained in the organic metal complex compound to metal in vacuum, for example, a metal (with a thermal reduction property) such as aluminum (Al), zirconium (Zr), titanium (Ti), and silicon (Si) or an alloy containing any of these metals can be used as the first electrode 11. Among these, Al which is generally widely used as a wiring electrode is particularly preferable from the viewpoint of ease of vapor deposition, high light reflectance, chemical stability, and the like.

The material of the second electrode 12 is not limited to a particular material. When light is to be extracted from the second electrode 12 side, a transparent, electrically conductive material such as, for example, ITO (Indium Tin Oxide) or IZO (Indium Zinc Oxide) can be used.

Moreover, in contrary to a general organic EL element, light can be extracted from the first electrode 11 side by using a metal material or the like for the second electrode 12 and using a transparent, electrically conductive material for the first electrode 11. For example, by employing the method described in "Japanese Patent Application Publication No. 2002-332567," the first electrode 11 made of the aforementioned transparent, electrically conductive material such as ITO and IZO can be formed by sputtering which does not damage an organic film.

Accordingly, when both of the first electrode 11 and the second electrode 12 are formed to be transparent, since the first light emitting unit 13A, the second light emitting unit 13B, the third light emitting unit 13C, the first charge generating layer 14A, and the second charge generating layer 14B are also similarly transparent, it is possible to manufacture a transparent organic EL element 10.

Note that the order of film formation does not have to start from the second electrode 12 side and may start from the first electrode 11 side.

The first light emitting unit 13A is formed of a first electron transport layer 15A, a first light emitting layer 16A, and a first hole transport layer 17A. The second light emitting unit 13B is formed of a second electron transport layer 15B, a second light emitting layer 16B, and a second hole transport layer 17B. The third light emitting unit 13C is formed of a third electron transport layer 15C, a third light emitting layer 16C, and a third hole transport layer 17C.

The first light emitting unit 13A, the second light emitting unit 13B, and the third light emitting unit 13C may employ any of various structures similar to those of conventionally-known organic EL elements and may have any laminated structure as long as they include light emitting layers made of at least an organic compound. For example, each of the first light emitting unit 13A, the second light emitting unit 13B, and the third light emitting unit 13C may be configured such that an electron injection layer, a hole blocking layer, and the like are arranged on the first electrode 11 side of the light emitting layer and a hole injection layer, an electron blocking layer, and the like are arranged on the second electrode 12 side of the light emitting layer.

The electron transport layers are made of, for example, a conventionally well-known electron transport material. In the organic EL element 10 of the embodiment, an electron transport material with a relatively deep HOMO (Highest Occupied Molecular Orbital) level is preferably used among electron transport materials generally used for organic EL elements. Specifically, an electron transport material with a HOMO level of at least about 6.0 eV is preferably used. For example, 4,7-Diphenyl-1,10-phenanthroline (Bphen), 2,2', 2"-(1,3,5-Benzinetriyl)-tris(1-phenyl-1-H-benzimidazol e) (TPBi), and the like can be used as such an electron transport material.

The electron injection layers are provided between the first electrode 11 and the first electron transport layer 15A and between the first charge generating layer 14A and the second electron transport layer 15B to improve injection efficiency of electrons from at least one of the first electrode 11 and the first charge generating layer 14A. An electron transport material having properties similar to the electron transport layers can be used as the material of the electron injection layers. The electron transport layers and the electron injection layers are sometimes collectively referred to as electron transport layers.

The hole transport layers are made of, for example, a conventionally well-known hole transport material. The hole transport material is not limited to a particular material. For example, an organic compound (electron donating material) which has an ionization potential less than 5.7 eV and which has a hole transport property, that is an electron donating property is preferably used as the hole transport material. For example, an arylamine compound such as 4,4'-bis-[N-(2-naphthyl)-N-phenyl-amino]biphenyl (α-NPD) or the like can be used as the electron donating material.

The hole injection layers are provided between the second electrode 12 and the second hole transport layer 17B and between the first charge generating layer 14A and the first hole transport layer 17A to improve injection efficiency of holes from at least one of the second electrode 12 and the first charge generating layer 14A. An electron donating material having properties similar to the hole transport layers can be used as the material of the hole injection layers. The hole transport layers and the hole injection layers are sometimes collectively referred to as hole transport layers.

When the first light emitting unit 13A is the red/green light emitting unit, the light emitting layer included in the first light emitting unit 13A is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the first light emitting unit 13A is the red-green light emitting unit, the light emitting layer included in the first light emitting unit 13A is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the first light emitting unit 13A, a material with an electron transport property, a material with a hole transport property, a material obtained by mixing these materials, or the like can be used. Specifically, for example, 4,4'-biscarbazolylbiphenyl (CBP), 2,9-dimethyl-4,7-diphenyl-9,10-phenanthroline (BCP), or the like can be used as the host material of the phosphorescent light emitting layer.

The guest material of the light emitting layer included in the first light emitting unit 13A is also referred to as dopant material. The guest material utilizing fluorescent light emission is generally referred to as fluorescent light emitting material. A light emitting layer made of the fluorescent light emitting material is referred to as fluorescent light emitting layer. Meanwhile, the guest material utilizing phosphorescent light emission is generally referred to as phosphorescent light emitting material. A light emitting layer made of the phosphorescent light emitting material is referred to as phosphorescent light emitting layer.

In the phosphorescent light emitting layer out of these layers, it is possible to utilize not only 75% of triplet excitons, which are generated by recombination of electrons and holes, but also 25% of the triplet excitons, which are generated by energy transfer from singlet excitons. Accordingly, an internal quantum efficiency of 100% can be achieved in theory. Specifically, the excitons generated by the recombination of electrons and holes are converted to light in the light emitting layer without thermal quenching or the like. In an organic metal complex including heavy atoms such as iridium or platinum, an internal quantum efficiency close to 100% is actually achieved by optimization of the element structure and the like.

The guest material of the phosphorescent light emitting layer is not limited to a particular material. For example, in the red phosphorescent light emitting layer, a red phosphorescent light emitting material such as $Ir(piq)_3$ and $Ir(btpy)_3$ can be used. Meanwhile, in the green phosphorescent light emitting layer, a green phosphorescent light emitting such as $Ir(ppy)_3$ can be used.

Each of the blue light emitting layers included in the second light emitting unit 13B and the third light emitting unit 13C is formed of a blue fluorescent light emitting layer containing a blue fluorescent material or a blue phosphorescent light emitting layer containing a blue phosphorescent material. Each blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layers included in the second light emitting unit 13B and the third light emitting unit 13C, a material with an electron transport property, a material with a hole transport property, a material obtained by mixing these materials, or the like can be used. In the blue fluorescent light emitting layers, for example, a styryl derivative, an anthracene compound, a pyrene compound, or the like can be used. Meanwhile, in the blue phosphorescent light emitting layer, for example, 4,4'-bis-carbazolylbiphenyl (CBP), 2,9-dimethyl-4,7-diphenyl-9,10-phenanthroline (BCP), or the like can be used.

As the guest material of the blue light emitting layers included in the second light emitting unit 13B and the third light emitting unit 13C, in the blue fluorescent light emitting layer, for example, a styrylamine compound, a fluoranthene compound, an aminopyrene compound, a boron complex, or the like can be used. Moreover, a material such as 4,4'-bis [4-(diphenylamino)styryl]biphenyl (BDAVBi) or 2,7-bis{2-[phenyl (m-tolyl)amino]-9,9-dimethyl-fluoren-7-yl}-9,9-di-methyl-fluorene (MDP3FL) can be used. Meanwhile, in the blue phosphorescent light emitting layer, for example, a blue phosphorescent light emitting material such as $Ir(Fppy)_3$ can be used.

For example, a vacuum deposition method, a spin coating method, or the like can be used as a film forming method of the layers forming the first light emitting unit 13A, the second light emitting unit 13B, and the third light emitting unit 13C.

The first charge generating layer 14A and the second charge generating layer 14B are each formed of an electrically insulating layer made of an electron accepting material and an electron donating material. The specific resistance of the electrically insulating layer is preferably $1.0 \times 10^2 \Omega \cdot cm$ or more, more preferably $1.0 \times 10^5 \Omega \cdot cm$ or more.

Alternatively, the first charge generating layer 14A and the second charge generating layer 14B may each be configured such that the charge generating layer is formed of a mixed layer of different materials and one component of the mixed layer forms a charge transfer complex by redox. In this case, when voltage is applied between the first electrode 11 and the second electrode 12, charges in the charge transfer complex move to the first electrode 11 side and the second electrode 12 side. In the organic EL element 10, holes are thereby injected into the second light emitting unit 13B located on the first electrode 11 side of the second charge generating layer 14B and into the first light emitting unit 13A located on the first electrode 11 side of the first charge generating layer 14A. Moreover, in the organic EL element 10, electrons are injected into the third light emitting unit 13C located on the second electrode 12 side of the second charge generating layer 14B and into the second light emitting unit 13B located on the second electrode 12 side of the first charge generating layer 14A. Light can be thereby simultaneously emitted from the first light emitting unit 13A, the second light emitting unit 13B, and the third light emitting unit 13C with the same current amount. Accordingly, a current efficiency and an external quantum efficiency proportionate to the sum of luminous efficiencies of the first light emitting unit 13A, the second light emitting unit 13B, and the third light emitting unit 13C can be obtained.

Alternatively, the first charge generating layer 14A and the second charge generating layer 14B may each be a laminate of an electron accepting material and an electron donating material. In this case, when voltage is applied between the first electrode 11 and the second electrode 12, in an interface between the electron accepting material and the electron donating material, charges generated by reaction involving electron transfer between these electron accepting material and electron donating material move to the first electrode 11 side and the second electrode 12 side. In the organic EL element 10, holes are thereby injected into the second light emitting unit 13B located on the first electrode 11 side of the second charge generating layer 14B and into the first light emitting unit 13A located on the first electrode 11 side of the first charge generating layer 14A. Moreover, in the organic EL element 10, electrons are injected into the third light emitting unit 13C located on the second electrode 12 side of the second charge generating layer 14B and into the second light emitting unit 13B located on the second electrode 12 side of the first charge generating layer 14A. Light can be thereby simultaneously emitted from the first light emitting unit 13A, the second light emitting unit 13B, and the third light emitting unit 13C with the same current amount. Accordingly, a current efficiency and an external quantum efficiency proportionate to the sum of luminous efficiencies of the first light emitting unit 13A, the second light emitting unit 13B, and the third light emitting unit 13C can be obtained.

For example, materials described in Japanese Patent Application Publication No. 2003-272860 can be used as materials forming the first charge generating layer 14A and the second charge generating layer 14B. Among these, materials described in paragraphs [0019] to [0021] can be preferably used. Alternatively, materials described in paragraphs [0023] to [0026] of "International Patent Application Publication No. WO2010/113493" can be used as materials forming the first charge generating layer 14A and the second charge generating layer 14B. Among these, a strong electron accepting material (HATCN6) described in paragraphs [0059] in particular can be preferably used. When substituent groups represented by R in the structure expressed by the following formula (1) are CN (cyano groups), this compound is HATCN6 described above.

[Chem. 2]

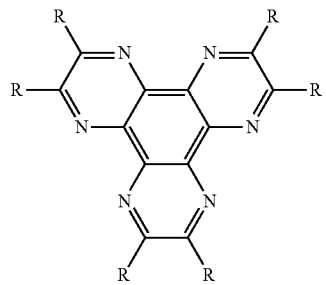

where R represents an electron withdrawing group of F, Cl, Br, I, CN, or CF$_3$ (1)

Figure 2:
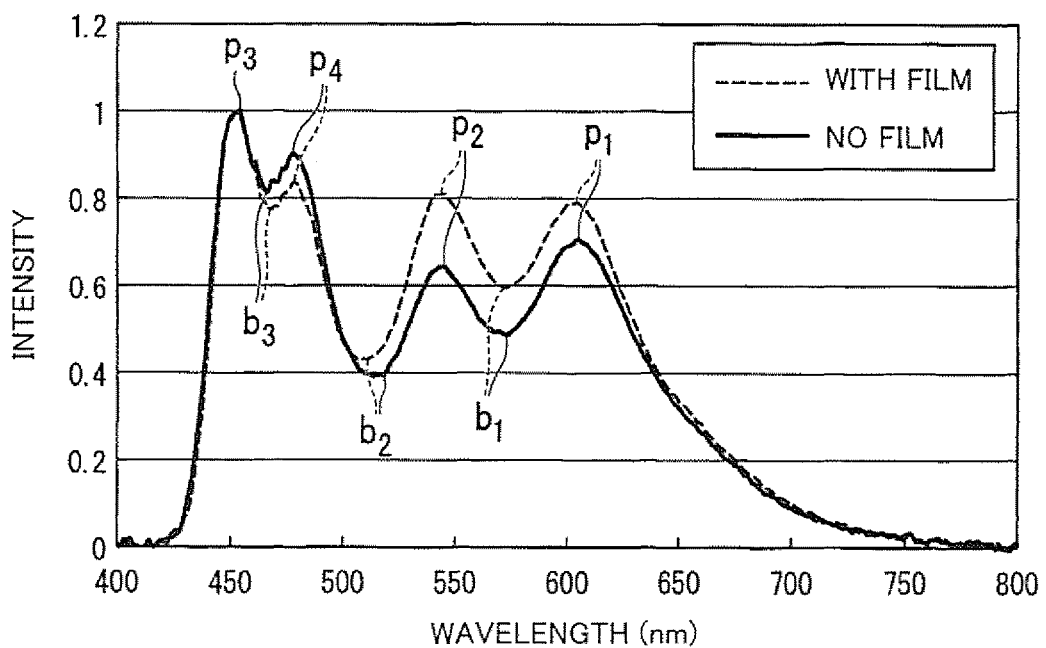
FIG. 2 is a graph illustrating examples of an emission spectrum of white light obtained in the first embodiment of the organic EL element in the present invention.

FIG. 2 is a graph depicting an example of an emission spectrum of white light provided by the organic EL element 10 of the embodiment.

Specifically, as illustrated in FIG. 2, the white light provided by the organic EL element 10 has an emission spectrum S continuous over the wavelength band of at least 380 nm to 780 nm as so-called visible light.

The emission spectrum S has one peak wavelength $p_1$ in the red wavelength band R of 590 nm to 640 nm, one peak wavelength $p_2$ in the green wavelength band G of 500 nm to 560 nm, and one peak wavelength $p_3$ or two peak wavelengths $p_3$, $p_4$ in the blue wavelength band B of 440 nm to 490 nm.

The blue light emitted by each blue light emitting layer is an important factor for obtaining white light with high color temperature. Specifically, it is desirable that, as illustrated in FIG. 2, the emission spectrum S has the one peak wavelength $p_3$ or the two peak wavelengths $p_3$, $p_4$ in the blue wavelength band B of 440 nm to 490 nm.

The organic EL element 10 of the embodiment can thereby provide white light with high color temperature. Moreover, in a conventional organic EL element, light emission in a low color temperature region such as incandescent lamp color is suitable for achieving highly-efficient light emission and highly-efficient light emission is difficult to achieve in a color temperature equal to or higher than warm white which is higher than the incandescent lamp color. Specifically, the maximum color temperature of the incandescent lamp color (L) is 3250 K in chromaticity ranges specified in "JIS Z 9112" and the organic EL element 10 of the embodiment can emit white light with correlated color temperature of 3300 K or higher with high efficiency.

Moreover, it is desirable that the light emission intensities of the peak wavelengths $p_3$, $p_4$ in the blue wavelength band B of 440 nm to 490 nm are higher than either of the light emission intensity of the peak wavelength $p_1$ in the red wavelength band R of 590 to 640 nm and the light emission intensity of the peak wavelength $p_2$ in the green wavelength band G of 500 nm to 560 nm.

This can further increase the color temperature of the white light in the organic EL element 10 of the embodiment. The organic EL element 10 of the embodiment can provide white light with correlated color temperature of 5000 K or higher.

Moreover, the position wavelength of the peak wavelength in the green wavelength band of 500 nm to 560 nm is an important factor for obtaining white light with high luminous efficiency. Specifically, as illustrated in FIG. 2, the emission spectrum S desirably has the peak wavelength $p_2$ around 540 nm in the green wavelength band G of 500 nm to 560 nm.

The organic EL element 10 of the embodiment can thereby provide white light with a high luminous efficiency. The organic EL element 10 of the embodiment can provide white light with an external quantum efficiency of 20% or more.

Note that, when the position of the peak wavelength $p_2$ is on the shorter wavelength side of 540 nm, the luminous efficiency of the white light decreases together with a decrease in luminosity function. Meanwhile, when the position of the peak wavelength $p_2$ is on the longer wavelength side of 540 nm, an amount of a green component of 550 nm to 600 nm increases and a light emission ratio of a pure green component on the short wavelength side thereby decreases. As a result, the color rendering property becomes poor.

Moreover, it is desirable that, as illustrated in FIG. 2, the light emission intensity of the peak wavelength $p_2$ in the green wavelength band G of 500 nm to 560 nm is lower than the light emission intensity of the peak wavelength $p_1$ in the red wavelength band R of 590 to 640 nm and the light emission intensities of the peak wavelengths $p_3$, $p_4$ in the blue wavelength band B of 440 nm to 490 nm.

The organic EL element 10 of the embodiment can be thereby further improved in the luminous efficiency of the white light. The organic EL element 10 of the embodiment can provide white light with an external quantum efficiency of 30% or more.

Note that, when the light emission intensity of the peak wavelength $p_2$ in the green wavelength band G of 500 nm to 560 nm is increased relative to the light emission intensity of the peak wavelength $p_1$ in the red wavelength band R of 590 to 640 nm and the light emission intensities of the peak wavelengths $p_3$, $p_4$ in the blue wavelength band B of 440 nm to 490 nm, the light emission intensity of a blue component relatively decreases and the color temperature thereby decreases.

Moreover, presence of a bottom wavelength in a wavelength band of 550 nm to 600 nm is an important factor for obtaining white light with an excellent color rendering property. Specifically, as illustrated in FIG. 2, the emission spectrum S desirably has one bottom wavelength $b_1$ in the wavelength band of 550 nm to 600 nm.

The organic EL element 10 of the embodiment can thereby provide white light with an excellent color rendering property. The organic EL element 10 of the embodiment can provide white light in which the average color rendering index (Ra) is 70 or more and R6 and R12 among the special color rendering indices (Ri) are 60 or more and 30 or more, respectively.

Figure 3:
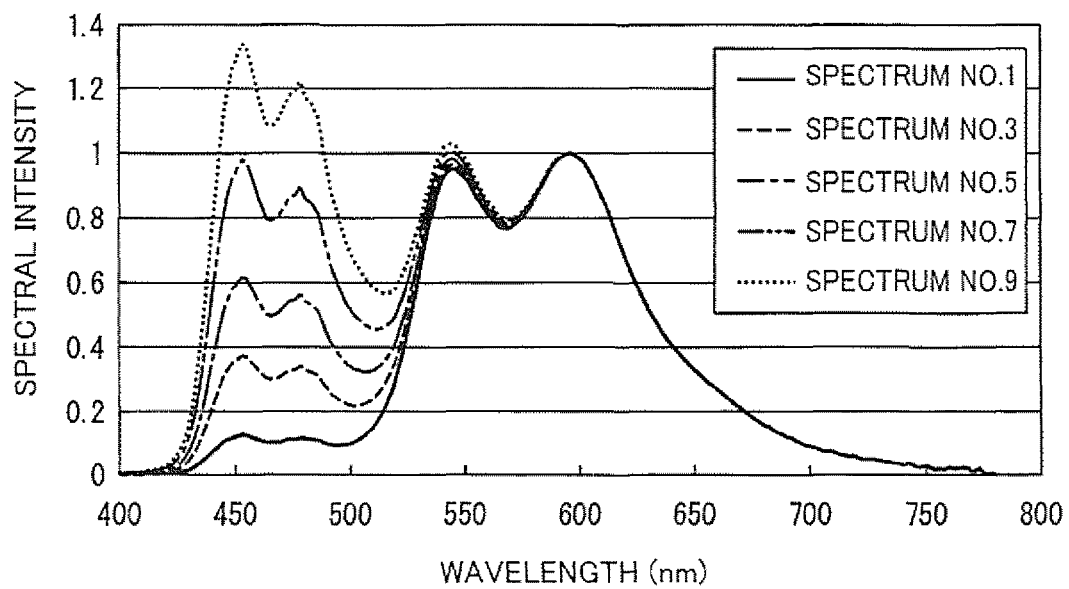
FIG. 3 is a view illustrating results of simulation conducted to verify effects on R6 and R12 in a white element.
Figure 4:
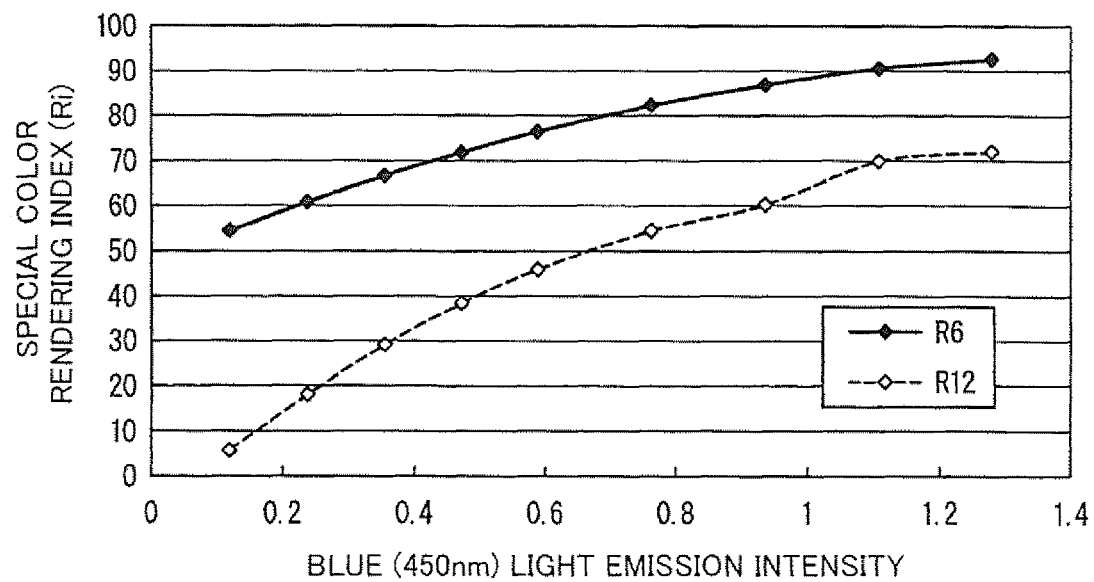
FIG. 4 is a view illustrating results of simulation conducted to verify effects on R6 and R12 in the white element.

Table 1 and FIGS. 3 and 4 depict results of simulation verifying the effects on R6 and R12 in a white element.

This simulation was performed such that the green and red light emission intensities were fixed to 1.0 in a three (blue, green, and red)-wavelength white element and numerical values were standardized by dividing the spectral intensity of the white light by the red peak wavelength intensity, the white light obtained with the light emission intensity of the blue spectrum set to a certain ratio. Moreover, various characteristic values were calculated with the light emission intensity of the blue spectrum varied at a certain ratio. The green and red light emission intensities were fixed to 1.0 to quantitatively evaluate the effects of the blue light emission on R6 and R12.

the value of the deviation duv is thus high. The spectrum No. 2 has light emission color to which the definition of correlated color temperature cannot be applied like the spectrum No. 1. Moreover, the spectrum No. 3 also greatly deviates from the black body radiation and emission of white light with good color cannot be achieved.

Meanwhile, in the spectra No. 4 to No. 9 which satisfy the conditions of R6 being 60 or more and R12 being 30 or more, emission of white light with a low value of deviation duv and an excellent color rendering property can be achieved. The deviation duv is preferably within a range of −0.015 to +0.015, more preferably within a range of −0.01 to +0.01.

Moreover, in the spectra No. 7 to No. 9 in which the value of R12 is 60 or more, light emission with higher color temperature and a better color rendering property than those in No. 4 to No. 6 is achieved and the values of the deviation duv are also small. Accordingly, emission of white light with an excellent color rendering property and high color temperature in particular are achieved.

Figure 5:
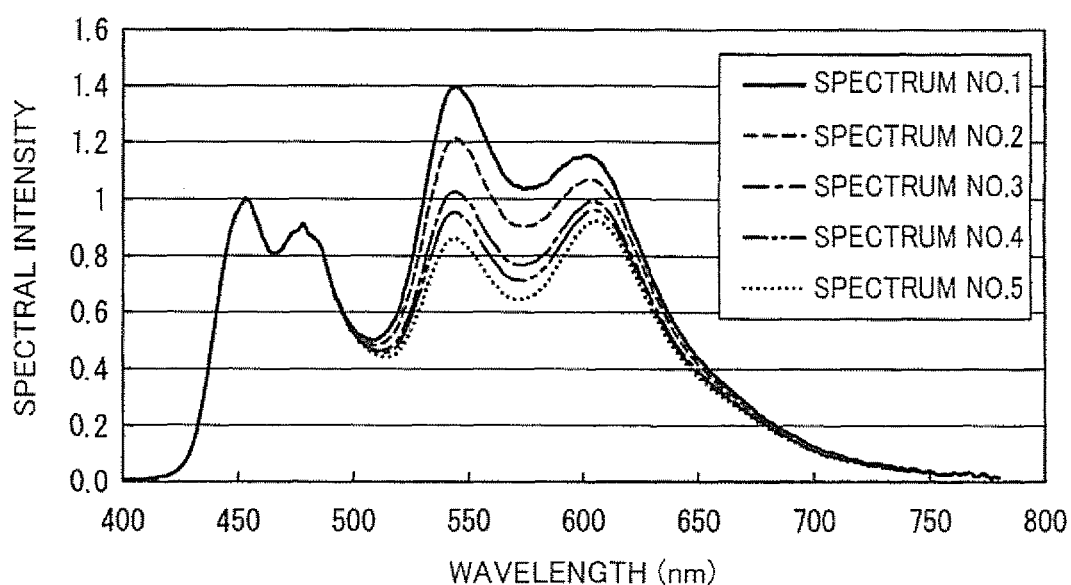
FIG. 5 is a view illustrating results of simulation conducted to verify effects on R6 and R12 in a white element.
Figure 6:
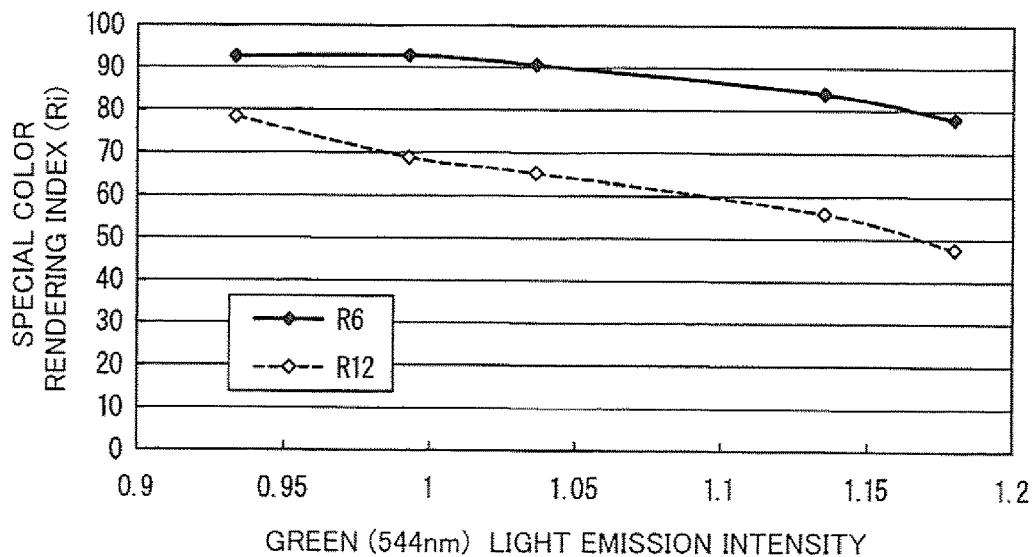
FIG. 6 is a view illustrating results of simulation conducted to verify effects on R6 and R12 in the white element.

Moreover, Table 2 and FIGS. 5 and 6 depict results of simulation verifying effects on R6 and R12 in a white element.

This simulation was performed such that the blue and red light emission intensities were fixed to 1.0 in a three (blue, green, and red)-wavelength white element and numerical values were standardized by dividing the spectral intensity of the white light by the blue peak wavelength intensity, the white light obtained with the light emission intensity of the green spectrum set to a certain ratio. Moreover, various characteristic values were calculated with the light emission intensity of the blue spectrum varied at a certain ratio. The blue and red light emission intensities were fixed to 1.0 to quantitatively evaluate the effects of green light emission on R6 and R12.

TABLE 1

| | Spectrum No. | | | | | | | | |
|---|---|---|---|---|---|---|---|---|---|
| | 1 | 2 | 3 | 4 | 5 | 6 | 7 | 8 | 9 |
| Blue (450 nm) light emission intensity | 0.120 | 0.237 | 0.355 | 0.472 | 0.589 | 0.763 | 0.936 | 1.108 | 1.280 |
| CCT (K) | — | — | 3630 | 3860 | 4100 | 4530 | 5000 | 5520 | 6140 |
| Deviation duv | 0.0247 | 0.0202 | 0.0166 | 0.0134 | 0.0107 | 0.0075 | 0.0053 | 0.0037 | 0.0032 |
| Ra | 61 | 64 | 68 | 71 | 73 | 77 | 80 | 83 | 85 |
| R6 | 54 | 61 | 67 | 72 | 76 | 82 | 87 | 91 | 93 |
| R12 | 6 | 18 | 29 | 38 | 46 | 54 | 60 | 70 | 72 |

"Blue (450 nm) light emission intensity" in Table 1 refers to the light emission intensity at 450 nm which is the peak wavelength in the blue spectrum.

FIG. 3 illustrates white spectra calculated by simulation performed with the intensity of the blue spectrum varied.

The blue spectrum, the green spectrum, and the red spectrum used in the simulation have the same wavelengths and waveforms as those of the emission spectrum of Example 1 to be described later.

It is found from Table 1 and FIG. 4 that the higher the blue light emission intensity is, the greater the values of Ra, R6 and R12 are.

In the spectrum No. 1 in which R6 is lower than 60, the value of the deviation duv is 0.02 or higher. Accordingly, the spectrum No. 1 has light emission color to which the definition of correlated color temperature cannot be applied.

In each of the spectrum No. 2 and the spectrum No. 3, although R6 is 60 or higher, the value of R12 is below 30 and Moreover, in FIG. 5, when the light emission intensity of the green spectrum is changed, the intensity of the red spectrum is also changed. This is because the peak wavelengths in the green spectrum and the red spectrum are close to each other and the light emission intensity in a tail portion of the green spectrum affects the light emission intensity of the red spectrum.

As illustrated in the spectrum. No. 5 of FIG. 5, the light emission intensity of the peak wavelength in the green wavelength band of 500 nm to 560 nm is lower than the light emission intensity of the peak wavelength in the blue wavelength band of 440 nm to 490 nm and the light emission intensity of the peak wavelength in the red wavelength band of 590 nm to 640 nm.

Moreover, as illustrated in the spectrum No. 5 of FIG. 5, the ratio of the light emission intensity of the peak wavelength in the green wavelength band of 500 nm to 560 nm to the light emission intensity of the peak wavelength in the red wavelength band of 590 nm to 640 nm is 0.9 or less.

TABLE 2

| | Spectrum No. | | | | |
|---|---|---|---|---|---|
| | 1 | 2 | 3 | 4 | 5 |
| Green (544 nm) light emission intensity | 1.180 | 1.136 | 1.037 | 0.993 | 0.934 |
| CCT (K) | 4650 | 4750 | 4850 | 4930 | 5020 |
| duv | 0.0122 | 0.008 | 0.0023 | −0.0001 | −0.0034 |
| Ra | 77 | 81 | 86 | 88 | 90 |
| R6 | 78 | 84 | 91 | 93 | 93 |
| R12 | 48 | 56 | 65 | 69 | 78 |

"Green (544 nm) light emission intensity" in table 2 refers to the light emission intensity at 544 nm which is the peak wavelength in the green spectrum.

FIG. 5 illustrates white spectra calculated by simulation performed with the intensity of the blue spectrum varied.

The blue spectrum, the green spectrum, and the red spectrum used in the simulation have the same wavelengths and waveforms as those of the emission spectrum of Example 1 to be described later.

It is found from Table 2 and FIG. 6 that the lower the green light emission intensity is, the greater the values of Ra, R6, and R12 are. Accordingly, it is found that the color rendering property can be improved by reducing the green light emission intensity in addition to the method of increasing the light emission intensity of the blue spectrum described in [0052] to [0056].

Moreover, in the organic EL element 10 of the embodiment, as illustrated in FIG. 2, the emission spectrum. S desirably has one bottom wavelength $b_2$ between the two peak wavelengths $p_2$, $p_3$ adjacent to each other in the blue wavelength band B and the green wavelength band G of 500 nm to 520 nm.

The luminous efficiency and the color rendering property of the white light can be thereby optimized at the same time by preferably controlling the ratio between the light emission intensities of the peak wavelengths $p_2$, $p_3$.

Moreover, in the organic EL element 10 of the embodiment, as illustrated in FIG. 2, the light emission intensity of the one bottom wavelength $b_2$ in the blue wavelength band B and the green wavelength band G of 500 nm to 520 nm is preferably lower than the light emission intensities of the bottom wavelengths $b_1$, $b_3$ in the wavelength band (green wavelength band G or red wavelength band R) of 570 nm to 590 nm.

The color temperature of the white light can be thereby optimized by appropriately controlling the light emission intensity ratio between peak wavelengths $p_1$ and $p_2$ forming the bottom wavelength $b_1$ and the light emission intensity ratio between the peak wavelengths $p_3$ and $p_4$ forming the bottom wavelength $b_3$.

Moreover, in the organic EL element 10 of the embodiment, as illustrated in FIG. 2, a ratio of (B) to (A) ((B)/(A)) is preferably 0.50 or smaller, where (A) is the light emission intensity of the peak wavelength having the highest light emission intensity (peak wavelength $p_1$ in FIG. 2) and (B) is the light emission intensity of the one bottom wavelength $b_1$ in the blue wavelength band B and the green wavelength band G of 500 nm to 520 nm.

The color temperature and the color rendering property of the white light can be thereby optimized at the same time.

As described above, the organic EL element 10 of the embodiment can provide white light with high color temperature, high luminous efficiency, and an excellent color rendering property. Moreover, since the organic EL element 10 of the embodiment has the MPE structure in which the first light emitting unit 13A, the second light emitting unit 13B, and the third light emitting unit 13C are stacked one on top of another with each of the first charge generating layer 14A and the second charge generating layer 14B sandwiched between the corresponding pair of adjacent light emitting units, the organic EL element 10 can provide the white light while achieving high-luminance light emission and long-life driving.

The organic EL element 10 of the embodiment can be thus preferably used in both of a display device and a lighting device.

Second Embodiment

Figure 7:
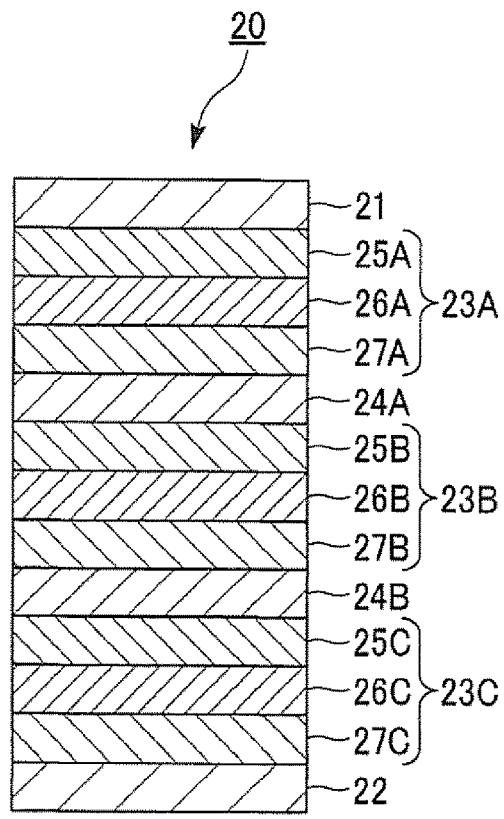
FIG. 7 is a cross-sectional view illustrating a schematic configuration of a second embodiment of the organic EL element in the present invention.

FIG. 7 is a cross-sectional view illustrating a schematic configuration of a second embodiment of the organic EL element in the present invention.

As illustrated in FIG. 7, the organic EL element 20 of the embodiment has a structure in which multiple light emitting units 23A, 23B, 23C each including a light emitting layer made of at least an organic compound are stacked one on top of another between a first electrode 21 and a second electrode 22 with each of charge generating layers (CGL) 24A, 24B sandwiched between a corresponding pair of the adjacent light emitting units. The organic EL element 20 is an organic EL element capable of providing white light by causing the multiple light emitting units 23A, 23B, 23C to emit light.

The organic EL element 20 of the embodiment includes the first light emitting unit 23A, the second light emitting unit 23B, and the third light emitting unit 23C.

The first light emitting unit 23A is a blue light emitting unit. The blue light emitting unit includes a light emitting layer formed of a blue light emitting layer which emits blue light with one or two peak wavelengths in the blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The second light emitting unit 23B is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The third light emitting unit 23C is a blue light emitting unit. The blue light emitting unit includes a light emitting layer formed of a blue light emitting layer which emits blue light with one or two peak wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The first light emitting unit 23A and the second light emitting unit 23B are stacked one on top of the other with the first charge generating layer 24A sandwiched therebetween.

The second light emitting unit 23B and the third light emitting unit 23C are stacked one on top of the other with the second charge generating layer 24B sandwiched therebetween.

The organic EL element 20 of the embodiment has a structure in which the second electrode 22, the third light emitting unit 23C, the second charge generating layer 24B, the second light emitting unit 23B, the first charge generating layer 24A, the first light emitting unit 23A, and the first electrode 21 are stacked one on top of another in this order. Specifically, the organic EL element 20 of the embodiment has an MPE structure in which the first light emitting unit 23A, the second light emitting unit 23B, and the third light emitting unit 23C are stacked one on top of another with each of the first charge generating layer 24A and the second charge generating layer 24B sandwiched between the corresponding pair of adjacent light emitting units.

In the organic EL element 20 of the embodiment, the white light produced by light emission of the first light emitting unit 23A, the second light emitting unit 23B, and the third light emitting unit 23C has an emission spectrum continuous over a wavelength band of at least 380 nm to 780 nm. Moreover, in the organic EL element 20 of the embodiment, the white light has one or two peak wavelengths in the blue wavelength band of 440 nm to 490 nm in this emission spectrum. Furthermore, in the organic EL element 20 of the embodiment, the white light has one peak wavelength in the red wavelength band of 590 nm to 640 nm and one or two peak wavelengths in the green wavelength band of 500 nm to 560 nm in this emission spectrum.

The same electrode as the first electrode 11 in the aforementioned first embodiment can be used as the first electrode 21.

The same electrode as the second electrode 12 in the aforementioned first embodiment can be used as the second electrode 22.

The first light emitting unit 23A is formed of a first electron transport layer 25A, a first light emitting layer 26A, and a first hole transport layer 27A. The second light emitting unit 23B is formed of a second electron transport layer 25B, a second light emitting layer 26B, and a second hole transport layer 27B. The third light emitting unit 23C is formed of a third electron transport layer 25C, a third light emitting layer 26C, and a third hole transport layer 27C.

The first light emitting unit 23A, the second light emitting unit 23B, and the third light emitting unit 23C may employ any of various structures similar to those of conventionally-known organic EL elements and may have any laminated structure as long as they include light emitting layers made of at least an organic compound. For example, each of the first light emitting unit 23A, the second light emitting unit 23B, and the third light emitting unit 23C may be configured such that an electron injection layer, a hole blocking layer, and the like are arranged on the first electrode 21 side of the light emitting layer and a hole injection layer, an electron blocking layer, and the like are arranged on the second electrode 22 side of the light emitting layer.

The electron transport layers have the same configuration as that of the electron transport layers in the aforementioned first embodiment.

The hole transport layers have the same configuration as that of the hole transport layers in the aforementioned first embodiment.

Each of the blue light emitting layers included in the first light emitting unit 23A and the third light emitting unit 23C is formed of a blue fluorescent light emitting layer containing a blue fluorescent material or a blue phosphorescent light emitting layer containing a blue phosphorescent material. Each blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layers included in the first light emitting unit 23A and the third light emitting unit 23C, the same material as the host material of the blue light emitting layers in the aforementioned first embodiment can be used.

As the guest material of the blue light emitting layers included in the first light emitting unit 23A and the third light emitting unit 23C, the same material as the guest material of the blue light emitting layers in the aforementioned first embodiment can be used.

When the second light emitting unit 23B is the red/green light emitting unit, the light emitting layer included in the second light emitting unit 23B is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the second light emitting unit 23B is the red-green light emitting unit, the light emitting layer included in the second light emitting unit 23B is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the second light emitting unit 23B, the same material as the host material of the light emitting layer included in the first light emitting unit 13A in the aforementioned first embodiment can be used.

As the guest material of the light emitting layer included in the second light emitting unit 23B, the same material as the guest material of the light emitting layer included in the first light emitting unit 13A in the aforementioned first embodiment can be used.

For example, a vacuum deposition method, a spin coating method, or the like can be used as a film forming method of the layers forming the first light emitting unit 23A, the second light emitting unit 23B, and the third light emitting unit 23C.

The first charge generating layer 24A and the second charge generating layer 24B are each formed of an electrically insulating layer made of an electron accepting material and an electron donating material. The specific resistance of the electrically insulating layer is preferably $1.0 \times 10^2 \Omega \cdot cm$ or more, more preferably $1.0 \times 10^5 \Omega \cdot cm$ or more.

Alternatively, the first charge generating layer 24A and the second charge generating layer 24B may each be configured such that the charge generating layer is formed of a mixed layer of different materials and one component of the mixed layer forms a charge transfer complex by redox. In this case, when voltage is applied between the first electrode 21 and the second electrode 22, charges in the charge transfer complex move to the first electrode 21 side and the second electrode 22 side. In the organic EL element 20, holes are thereby injected into the second light emitting unit 23B located on the first electrode 21 side of the second charge generating layer 24B and into the first light emitting unit 23A located on the first electrode 21 side of the first charge generating layer 24A. Moreover, in the organic EL element 20, electrons are injected into the third light emitting unit 23C located on the second electrode 22 side of the second charge generating layer 24B and into the second light emitting unit 23B located on the second electrode 22 side of the first charge generating layer 24A. Light can be thereby simultaneously emitted from the first light emitting unit 23A, the second light emitting unit 23B, and the third light emitting unit 23C with the same current amount. Accordingly, a current efficiency and an external quantum efficiency proportionate to the sum of luminous efficiencies of the first light emitting unit 23A, the second light emitting unit 23B, and the third light emitting unit 23C can be obtained.

Alternatively, the first charge generating layer 24A and the second charge generating layer 24B may each be a laminate of an electron accepting material and an electron donating material. In this case, when voltage is applied between the first electrode 21 and the second electrode 22, in an interface between the electron accepting material and the electron donating material, charges generated by reaction involving electron transfer between these electron accepting material and electron donating material move to the first electrode 21 side and the second electrode 22 side. In the organic EL element 20, holes are thereby injected into the second light emitting unit 23B located on the first electrode 21 side of the second charge generating layer 24B and into the first light emitting unit 23A located on the first electrode 21 side of the first charge generating layer 24A. Moreover, in the organic EL element 20, electrons are injected into the third light emitting unit 23C located on the second electrode 22 side of the second charge generating layer 24B and into the second light emitting unit 23B located on the second electrode 22 side of the first charge generating layer 24A. Light can be thereby simultaneously emitted from the first light emitting unit 23A, the second light emitting unit 23B, and the third light emitting unit 23C with the same current amount. Accordingly, a current efficiency and an external quantum efficiency proportionate to the sum of luminous efficiencies of the first light emitting unit 23A, the second light emitting unit 23B, and the third light emitting unit 23C can be obtained.

As materials forming the first charge generating layer 24A and the second charge generating layer 24B, the same materials as the materials forming the first charge generating layer 14A and the second charge generating layer 14B in the aforementioned first embodiment can be used.

The organic EL element 20 having the structure described above can provide white light by causing the first light emitting unit 23A, the second light emitting unit 23B, and the third light emitting unit 23C to emit light.

Moreover, the organic EL element 20 of the embodiment can provide white light with high color temperature, high luminous efficiency, and an excellent color rendering property as in the organic EL element 10 in the aforementioned first embodiment. Moreover, the organic EL element 20 of the embodiment has the MPE structure in which the first light emitting unit 23A, the second light emitting unit 23B, and the third light emitting unit 23C are stacked one on top of another with each of the first charge generating layer 24A and the second charge generating layer 24B sandwiched between the corresponding pair of adjacent light emitting units. Accordingly, the organic EL element 20 can provide the white light while achieving high-luminance light emission and long-life driving.

The organic EL element 20 of the embodiment can be thus preferably used in both of a display device and a lighting device.

Third Embodiment

Figure 8:
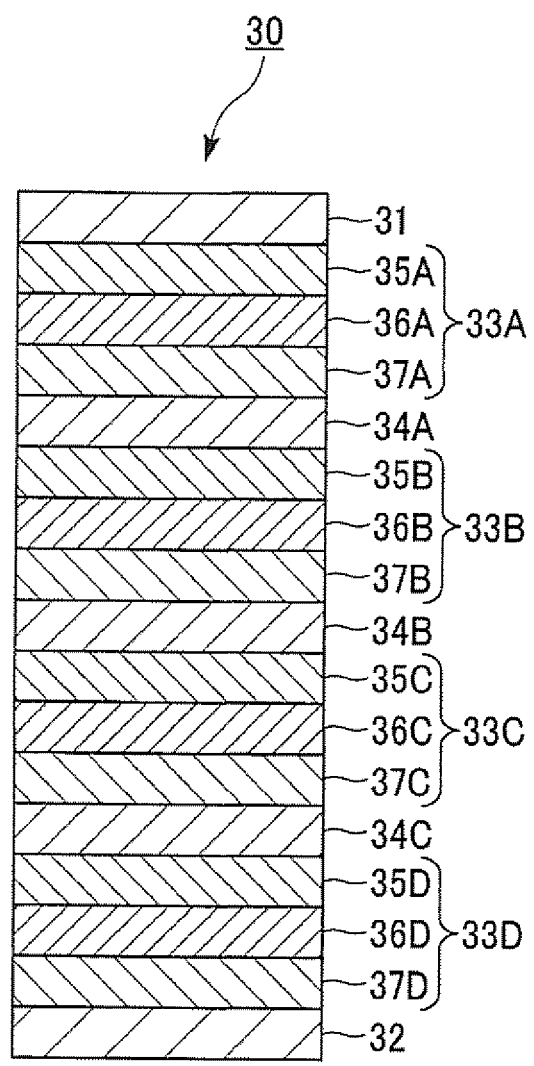
FIG. 8 is a cross-sectional view illustrating a schematic configuration of a third embodiment of the organic EL element in the present invention.

FIG. 8 is a cross-sectional view illustrating a schematic configuration of a third embodiment of the organic EL element in the present invention.

As illustrated in FIG. 8, the organic EL element 30 of the embodiment has a structure in which multiple light emitting units 33A, 33B, 33C, 33D each including a light emitting layer made of at least an organic compound are stacked one on top of another between a first electrode 31 and a second electrode 32 with each of charge generating layers (CGL) 34A, 34B, 34C sandwiched between a corresponding pair of the adjacent light emitting units. The organic EL element 30 is an organic EL element capable of providing white light by causing the multiple light emitting units 33A, 33B, 33C, 33D to emit light.

The organic EL element 30 of the embodiment includes the first light emitting unit 33A, the second light emitting unit 33B, the third light emitting unit 33C, and the fourth light emitting unit 33D.

The first light emitting unit 33A is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The second light emitting unit 33B is a blue light emitting unit. The blue light emitting unit includes a light emitting layer formed of a blue light emitting layer which emits blue light with one or two peak wavelengths in the blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The third light emitting unit 33C is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The fourth light emitting unit 33D is a blue light emitting unit. The blue light emitting unit includes a light emitting layer formed of a blue light emitting layer which emits blue light with one or two peak wavelengths in the blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The first light emitting unit 33A and the second light emitting unit 33B are stacked one on top of the other with the first charge generating layer 34A sandwiched therebetween.

The second light emitting unit 33B and the third light emitting unit 33C are stacked one on top of the other with the second charge generating layer 34B sandwiched therebetween.

The third light emitting unit 33C and the fourth light emitting unit 33D are stacked one on top of the other with the third charge generating layer 34C sandwiched therebetween.

The organic EL element 30 of the embodiment has a structure in which the second electrode 32, the fourth light emitting unit 33D, the third charge generating layer 34C, the third light emitting unit 33C, the second charge generating layer 34B, the second light emitting unit 33B, the first charge generating layer 34A, the first light emitting unit 33A, and the first electrode 31 are stacked one on top of another in this order. Specifically, the organic EL element 30 of the embodiment has an MPE structure in which the first light emitting unit 33A, the second light emitting unit 33B, the third light emitting unit 33C, and the fourth light emitting unit 33D are stacked one on top of another with each of the first charge generating layer 34A, the second charge generating layer 34B, and the third charge generating layer 34C sandwiched between the corresponding pair of adjacent light emitting units.

In the organic EL element 30 of the embodiment, the white light produced by light emission of the first light emitting unit 33A, the second light emitting unit 33B, the third light emitting unit 33C, and the fourth light emitting unit 33D has an emission spectrum continuous over a wavelength band of at least 380 nm to 780 nm. Moreover, in the organic EL element 30 of the embodiment, the white light has one or two peak wavelengths in the blue wavelength band of 440 nm to 490 nm in this emission spectrum. Furthermore, in the organic EL element 30 of the embodiment, the white light has one peak wavelength in the red wavelength band of 590 nm to 640 nm and one or two peak wavelengths in the green wavelength band of 500 nm to 560 nm in this emission spectrum.

The same electrode as the first electrode 11 in the aforementioned first embodiment can be used as the first electrode 31.

The same electrode as the second electrode 12 in the aforementioned first embodiment can be used as the second electrode 32.

The first light emitting unit 33A is formed of a first electron transport layer 35A, a first light emitting layer 36A, and a first hole transport layer 37A. The second light emitting unit 33B is formed of a second electron transport layer 35B, a second light emitting layer 36B, and a second hole transport layer 37B. The third light emitting unit 33C is formed of a third electron transport layer 35C, a third light emitting layer 36C, and a third hole transport layer 37C. The fourth light emitting unit 33D is formed of a fourth electron transport layer 35D, a fourth light emitting layer 36D, and a fourth hole transport layer 37D.

The first light emitting unit 33A, the second light emitting unit 33B, the third light emitting unit 33C, and the fourth light emitting unit 33D may employ any of various structures similar to those of conventionally-known organic EL elements and may have any laminated structure as long as they include light emitting layers made of at least an organic compound. For example, each of the first light emitting unit 33A, the second light emitting unit 33B, the third light emitting unit 33C, and the fourth light emitting unit 33D may be configured such that an electron injection layer, a hole blocking layer, and the like are arranged on the first electrode 31 side of the light emitting layer and a hole injection layer, an electron blocking layer, and the like are arranged on the second electrode 32 side of the light emitting layer.

The electron transport layers have the same configuration as that of the electron transport layers in the aforementioned first embodiment.

The hole transport layers have the same configuration as that of the hole transport layers in the aforementioned first embodiment.

When the first light emitting unit 33A is the red/green light emitting unit, the light emitting layer included in the first light emitting unit 33A is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the first light emitting unit 33A is the red-green light emitting unit, the light emitting layer included in the first light emitting unit 33A is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the first light emitting unit 33A, the same material as the host material of the light emitting layer included in the first light emitting unit 13A in the aforementioned first embodiment can be used.

As the guest material of the light emitting layer included in the first light emitting unit 33A, the same material as the guest material of the light emitting layer included in the first light emitting unit 13A in the aforementioned first embodiment can be used.

The blue light emitting layer included in the second light emitting unit 33B is formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layer included in the second light emitting unit 33B, the same material as the host material of the blue light emitting layers in the aforementioned first embodiment can be used.

As the guest material of the blue light emitting layer included in the second light emitting unit 33B, the same material as the guest material of the blue light emitting layers in the aforementioned first embodiment can be used.

When the third light emitting unit 33C is the red/green light emitting unit, the light emitting layer included in the third light emitting unit 33C is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the third light emitting unit 33C is the red-green light emitting unit, the light emitting layer included in the third light emitting unit 33C is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the third light emitting unit 33C, the same material as the host material of the light emitting layer included in the first light emitting unit 13A in the aforementioned first embodiment can be used.

As the guest material of the light emitting layer included in the third light emitting unit 33C, the same material as the guest material of the light emitting layer included in the first light emitting unit 13A in the aforementioned first embodiment can be used.

The blue light emitting layer included in the fourth light emitting unit 33D is formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layer included in the fourth light emitting unit 33D, the same material as the host material of the blue light emitting layers in the aforementioned first embodiment can be used.

As the guest material of the blue light emitting layer included in the fourth light emitting unit 33D, the same material as the guest material of the blue light emitting layers in the aforementioned first embodiment can be used.

For example, a vacuum deposition method, a spin coating method, or the like can be used as a film forming method of the layers forming the first light emitting unit 33A, the second light emitting unit 33B, the third light emitting unit 33C, and the fourth light emitting unit 33D.

The first charge generating layer 34A, the second charge generating layer 34B, and the third charge generating layer 34C are each formed of an electrically insulating layer made of an electron accepting material and an electron donating material. The specific resistance of the electrically insulating layer is preferably $1.0\times10^2$ Ω·cm or more, more preferably $1.0\times10^5$ Ω·cm or more.

Alternatively, the first charge generating layer 34A, the second charge generating layer 34B, and the third charge generating layer 34C may each be configured such that the charge generating layer is formed of a mixed layer of different materials and one component of the mixed layer forms a charge transfer complex by redox. In this case, when voltage is applied between the first electrode 31 and the second electrode 32, charges in the charge transfer complex move to the first electrode 31 side and the second electrode 32 side. Holes are thereby injected into the third light emitting unit 33C located on the first electrode 31 side of the third charge generating layer 34C, the second light emitting unit 33B located on the first electrode 31 side of the second charge generating layer 34B, and the first light emitting unit 33A located on the first electrode 31 side of the first charge generating layer 34A. Moreover, electrons are injected into the fourth light emitting unit 33D located on the second electrode 32 side of the third charge generating layer 34C, the third light emitting unit 33C located on the second electrode 32 side of the second charge generating layer 34B, and the second light emitting unit 33B located on the second electrode 32 side of the first charge generating layer 34A. Light can be thereby simultaneously emitted from the first light emitting unit 33A, the second light emitting unit 33B, the third light emitting unit 33C, and the fourth light emitting unit 33D with the same current amount. Accordingly, a current efficiency and an external quantum efficiency proportionate to the sum of luminous efficiencies of the first light emitting unit 33A, the second light emitting unit 33B, the third light emitting unit 33C, and the fourth light emitting unit 33D can be obtained.

Alternatively, the first charge generating layer 34A, the second charge generating layer 34B, and the third charge generating layer 34C may each be a laminate of an electron accepting material and an electron donating material. In this case, when voltage is applied between the first electrode 31 and the second electrode 32, in an interface between the electron accepting material and the electron donating material, charges generated by reaction involving electron transfer between these electron accepting material and electron donating material move to the first electrode 31 side and the second electrode 32 side. In the organic EL element 30, holes are thereby injected into the third light emitting unit 33C located on the first electrode 31 side of the third charge generating layer 34C, the second light emitting unit 33B located on the first electrode 31 side of the second charge generating layer 34B, and the first light emitting unit 33A located on the first electrode 31 side of the first charge generating layer 34A. Moreover, in the organic EL element 30, electrons are injected into the fourth light emitting unit 33D located on the second electrode 32 side of the third charge generating layer 34C, the third light emitting unit 33C located on the second electrode 32 side of the second charge generating layer 34B, and the second light emitting unit 33B located on the second electrode 32 side of the first charge generating layer 34A. Light can be thereby simultaneously emitted from the first light emitting unit 33A, the second light emitting unit 33B, the third light emitting unit 33C, and the fourth light emitting unit 33D with the same current amount. Accordingly, a current efficiency and an external quantum efficiency proportionate to the sum of luminous efficiencies of the first light emitting unit 33A, the second light emitting unit 33B, the third light emitting unit 33C, and the fourth light emitting unit 33D can be obtained.

As materials forming the first charge generating layer 34A, the second charge generating layer 34B, and the third charge generating layer 34C, the same materials as the materials forming the first charge generating layer 14A and the second charge generating layer 14B in the aforementioned first embodiment can be used.

The organic EL element 30 having the structure described above can provide white light by causing the first light emitting unit 33A, the second light emitting unit 33B, the third light emitting unit 33C, and the fourth light emitting unit 33D to emit light.

Moreover, the organic EL element 30 of the embodiment can provide white light with high color temperature, high luminous efficiency, and an excellent color rendering property as in the organic EL element 10 in the aforementioned first embodiment. Moreover, the organic EL element 30 of the embodiment has the MPE structure in which the first light emitting unit 33A, the second light emitting unit 33B, the third light emitting unit 33C, and the fourth light emitting unit 33D are stacked one on top of another with each of the first charge generating layer 34A, the second charge generating layer 34B, and the third charge generating layer 34C sandwiched between the corresponding pair of adjacent light emitting units. Accordingly, the organic EL element 30 can provide the white light while achieving high-luminance light emission and long-life driving.

The organic EL element 30 of the embodiment can be thus preferably used in both of a display device and a lighting device.

Fourth Embodiment

Figure 9:
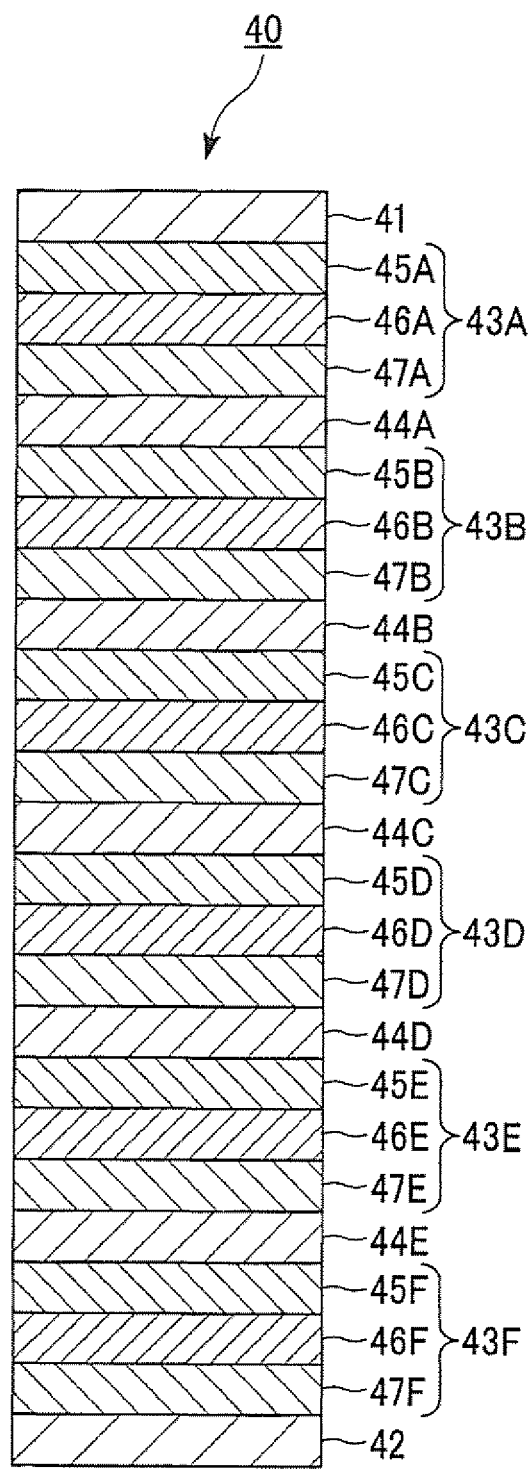
FIG. 9 is a cross-sectional view illustrating a schematic configuration of a fourth embodiment of the organic EL element in the present invention.

FIG. 9 is a cross-sectional view illustrating a schematic configuration of a fourth embodiment of the organic EL element in the present invention.

As illustrated in FIG. 9, the organic EL element 40 of the embodiment has a structure in which multiple light emitting units 43A, 43B, 43C, 43D, 43E, 43F each including a light emitting layer made of at least an organic compound are stacked one on top of another between a first electrode 41 and a second electrode 42 with each of charge generating layers (CGL) 44A, 44B, 44C, 44D, 44E sandwiched between a corresponding pair of the adjacent light emitting units. The organic EL element 40 is an organic EL element capable of providing white light by causing the multiple light emitting units 43A, 43B, 43C, 43D, 43E, 43F to emit light.

The organic EL element 40 of the embodiment includes the first light emitting unit 43A, the second light emitting unit 43B, the third light emitting unit 43C, the fourth light emitting unit 43D, the fifth light emitting unit 43E, and the sixth light emitting unit 43F.

The first light emitting unit 43A is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes a light emitting layer formed of a mixed layer of a red phosphorescent material and a green phosphorescent material. Specifically, the red-green light emitting unit is one layer (single layer) containing the red phosphorescent material and the green phosphorescent material.

The second light emitting unit 43B is a blue light emitting unit. The blue light emitting unit includes a light emitting layer formed of a blue light emitting layer which emits blue light with one or two peak wavelengths in the blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The third light emitting unit 43C is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The fourth light emitting unit 43D is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The fifth light emitting unit 43E is a blue light emitting unit. The blue light emitting unit includes a light emitting layer formed of a blue light emitting layer which emits blue light with one or two peak wavelengths in the blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The sixth light emitting unit 43F is a red/green light emitting unit or a red-green light emitting unit. The red/green light emitting unit includes a light emitting layer formed of a red phosphorescent light emitting layer which emits red light with one peak wavelength in a red wavelength band and a green phosphorescent light emitting layer which emits green light with one or two peak wavelengths in a green wavelength band. Specifically, the red/green light emitting unit is a layer formed by stacking the red phosphorescent light emitting layer and the green phosphorescent light emitting layer one on top of the other. The red-green light emitting unit includes alight emitting layer formed of a mixed layer of a red phosphorescent material and a green phosphorescent material. Specifically, the red-green light emitting unit is one layer (single layer) containing the red phosphorescent material and the green phosphorescent material.

The first light emitting unit 43A and the second light emitting unit 43B are stacked one on top of the other with the first charge generating layer 44A sandwiched therebetween.

The second light emitting unit 43B and the third light emitting unit 43C are stacked one on top of the other with the second charge generating layer 44B sandwiched therebetween.

The third light emitting unit 43C and the fourth light emitting unit 43D are stacked one on top of the other with the third charge generating layer 44C sandwiched therebetween.

The fourth light emitting unit 43D and the fifth light emitting unit 43E are stacked one on top of the other with the fourth charge generating layer 44D sandwiched therebetween.

The fifth light emitting unit 43E and the sixth light emitting unit 43F are stacked one on top of the other with the fifth charge generating layer 44E sandwiched therebetween.

The organic EL element 40 of the embodiment has a structure in which the second electrode 42, the sixth light emitting unit 43F, the fifth charge generating layer 44E, the fifth light emitting unit 43E, the fourth charge generating layer 44D, the fourth light emitting unit 43D, the third charge generating layer 44C, the third light emitting unit 43C, the second charge generating layer 44B, the second light emitting unit 43B, the first charge generating layer 44A, the first light emitting unit 43A, and the first electrode 41 are stacked one on top of another in this order. Specifically, the organic EL element 40 of the embodiment has an MPE structure in which the first light emitting unit 43A, the second light emitting unit 43B, the third light emitting unit 43C, the fourth light emitting unit 43D, the fifth light emitting unit 43E, and the sixth light emitting unit 43F are stacked one on top of another with each of the first charge generating layer 44A, the second charge generating layer 44B, the third charge generating layer 44C, the fourth charge generating layer 44D, and the fifth charge generating layer 44E sandwiched between the corresponding pair of adjacent light emitting units.

In the organic EL element 40 of the embodiment, the white light produced by light emission of the first light emitting unit 43A, the second light emitting unit 43B, the third light emitting unit 43C, the fourth light emitting unit 43D, the fifth light emitting unit 43E, and the sixth light emitting unit 43F has an emission spectrum continuous over a wavelength band of at least 380 nm to 780 nm. Moreover, in the organic EL element 40 of the embodiment, the white light has one or two peak wavelengths in the blue wavelength band of 440 nm to 490 nm in this emission spectrum. Furthermore, in the organic EL element 40 of the embodiment, the white light has one peak wavelength in the red wavelength band of 590 nm to 640 nm and one or two peak wavelengths in the green wavelength band of 500 nm to 560 nm in this emission spectrum.

The same electrode as the first electrode 11 in the aforementioned first embodiment can be used as the first electrode 41.

The same electrode as the second electrode 12 in the aforementioned first embodiment can be used as the second electrode 42.

The first light emitting unit 43A is formed of a first electron transport layer 45A, a first light emitting layer 46A, and a first hole transport layer 47A. The second light emitting unit 43B is formed of a second electron transport layer 45B, a second light emitting layer 46B, and a second hole transport layer 47B. The third light emitting unit 43C is formed of a third electron transport layer 45C, a third light emitting layer 46C, and a third hole transport layer 47C. The fourth light emitting unit 43D is formed of a fourth electron transport layer 45D, a fourth light emitting layer 46D, and a fourth hole transport layer 47D. The fifth light emitting unit 43E is formed of a fifth electron transport layer 45E, a fifth light emitting layer 46E, and a fifth hole transport layer 47E. The sixth light emitting unit 43F is formed of a sixth electron transport layer 45F, a sixth light emitting layer 46F, and a sixth hole transport layer 47F.

The first light emitting unit 43A, the second light emitting unit 43B, the third light emitting unit 43C, the fourth light emitting unit 43D, the fifth light emitting unit 43E, and the sixth light emitting unit 43F may employ any of various structures similar to those of conventionally-known organic EL elements and may have any laminated structure as long as they include light emitting layers made of at least an organic compound. For example, each of the first light emitting unit 43A, the second light emitting unit 43B, the third light emitting unit 43C, the fourth light emitting unit 43D, the fifth light emitting unit 43E, and the sixth light emitting unit 43F may be configured such that an electron injection layer, a hole blocking layer, and the like are arranged on the first electrode 41 side of the light emitting layer and a hole injection layer, an electron blocking layer, and the like are arranged on the second electrode 42 side of the light emitting layer.

The electron transport layers have the same configuration as that of the electron transport layers in the aforementioned first embodiment.

The hole transport layers have the same configuration as that of the hole transport layers in the aforementioned first embodiment.

When the first light emitting unit 43A is the red/green light emitting unit, the light emitting layer included in the first light emitting unit 43A is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the first light emitting unit 43A is the red-green light emitting unit, the light emitting layer included in the first light emitting unit 43A is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the first light emitting unit 43A, the same material as the host material of the light emitting layer included in the first light emitting unit 13A in the aforementioned first embodiment can be used.

As the guest material of the light emitting layer included in the first light emitting unit 43A, the same material as the guest material of the light emitting layer included in the first light emitting unit 13A in the aforementioned first embodiment can be used.

The blue light emitting layer included in the second light emitting unit 43B is formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layer included in the second light emitting unit 43B, the same material as the host material of the blue light emitting layers in the aforementioned first embodiment can be used.

As the guest material of the blue light emitting layer included in the second light emitting unit 43B, the same material as the guest material of the blue light emitting layers in the aforementioned first embodiment can be used.

When the third light emitting unit 43C is the red/green light emitting unit, the light emitting layer included in the third light emitting unit 43C is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the third light emitting unit 43C is the red-green light emitting unit, the light emitting layer included in the third light emitting unit 43C is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the third light emitting unit 43C, the same material as the host material of the light emitting layer included in the first light emitting unit 13A in the aforementioned first embodiment can be used.

As the guest material of the light emitting layer included in the third light emitting unit 43C, the same material as the guest material of the light emitting layer included in the first light emitting unit 13A in the aforementioned first embodiment can be used.

When the fourth light emitting unit 43D is the red/green light emitting unit, the light emitting layer included in the fourth light emitting unit 43D is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the fourth light emitting unit 43D is the red-green light emitting unit, the light emitting layer included in the fourth light emitting unit 43D is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the fourth light emitting unit 43D, the same material as the host material of the light emitting layer included in the first light emitting unit 13A in the aforementioned first embodiment can be used.

As the guest material of the light emitting layer included in the fourth light emitting unit 43D, the same material as the guest material of the light emitting layer included in the first light emitting unit 13A in the aforementioned first embodiment can be used.

The blue light emitting layer included in the fifth light emitting unit 43E is formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layer included in the fifth light emitting unit 43E, the same material as the host material of the blue light emitting layers in the aforementioned first embodiment can be used.

As the guest material of the blue light emitting layer included in the fifth light emitting unit 43E, the same material as the guest material of the blue light emitting layers in the aforementioned first embodiment can be used.

When the sixth light emitting unit 43F is the red/green light emitting unit, the light emitting layer included in the sixth light emitting unit 43F is formed of a red phosphorescent light emitting layer and a green phosphorescent light emitting layer. The red phosphorescent light emitting layer and the green phosphorescent light emitting layer each contain a host material which is a main component and a guest material which is a minor component as the organic compound. When the sixth light emitting unit 43F is the red-green light emitting unit, the light emitting layer included in the sixth light emitting unit 43F is formed of a mixed layer of a red phosphorescent material and a green phosphorescent material. The mixed layer of the red phosphorescent material and the green phosphorescent material contains a host material which is a main component and a guest material which is a minor component as the organic compound. The red phosphorescent material and the green phosphorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light.

As the host material of the light emitting layer included in the sixth light emitting unit 43F, the same material as the host material of the light emitting layer included in the first light emitting unit 13A in the aforementioned first embodiment can be used.

As the guest material of the light emitting layer included in the sixth light emitting unit 43F, the same material as the guest material of the light emitting layer included in the first light emitting unit 13A in the aforementioned first embodiment can be used.

For example, a vacuum deposition method, a spin coating method, or the like can be used as a film forming method of the layers forming the first light emitting unit 43A, the second light emitting unit 43B, the third light emitting unit 43C, the fourth light emitting unit 43D, the fifth light emitting unit 43E, and the sixth light emitting unit 43F.

The first charge generating layer 44A, the second charge generating layer 44B, the third charge generating layer 44C, the fourth charge generating layer 44D, and the fifth charge generating layer 44E are each formed of an electrically insulating layer made of an electron accepting material and an electron donating material. The specific resistance of the electrically insulating layer is preferably $1.0 \times 10^2 \Omega \cdot cm$ or more, more preferably $1.0 \times 10^5 \Omega \cdot cm$ or more.

Alternatively, the first charge generating layer 44A, the second charge generating layer 44B, the third charge generating layer 44C, the fourth charge generating layer 44D, and the fifth charge generating layer 44E may each be configured such that the charge generating layer is formed of a mixed layer of different materials and one component of the mixed layer forms a charge transfer complex by redox. In this case, when voltage is applied between the first electrode 41 and the second electrode 42, charges in the charge transfer complex move to the first electrode 41 side and the second electrode 42 side. In the organic EL element 40, holes are thereby injected into the fifth light emitting unit 43E located on the first electrode 41 side of the fifth charge generating layer 44E, the fourth light emitting unit 43D located on the first electrode 41 side of the fourth charge generating layer 44D, the third light emitting unit 43C located on the first electrode 41 side of the third charge generating layer 44C, the second light emitting unit 43B located on the first electrode 41 side of the second charge generating layer 44B, and the first light emitting unit 43A located on the first electrode 41 side of the first charge generating layer 44A. Moreover, in the organic EL element 40, electrons are injected into the sixth light emitting unit 43F located on the second electrode 42 side of the fifth charge generating layer 44E, the fifth light emitting unit 43E located on the second electrode 42 side of the fourth charge generating layer 44D, the fourth light emitting unit 43D located on the second electrode 42 side of the third charge generating layer 44C, the third light emitting unit 43C located on the second electrode 42 side of the second charge generating layer 44B, and the second light emitting unit 43B located on the second electrode 42 side of the first charge generating layer 44A. Light can be thereby simultaneously emitted from the first light emitting unit 43A, the second light emitting unit 43B, the third light emitting unit 43C, the fourth light emitting unit 43D, the fifth light emitting unit 43E, and the sixth light emitting unit 43F with the same current amount. Accordingly, a current efficiency and an external quantum efficiency proportionate to the sum of luminous efficiencies of the first light emitting unit 43A, the second light emitting unit 43B, the third light emitting unit 43C, the fourth light emitting unit 43D, the fifth light emitting unit 43E, and the sixth light emitting unit 43F can be obtained.

Alternatively, the first charge generating layer 44A, the second charge generating layer 44B, the third charge generating layer 44C, the fourth charge generating layer 44D, and the fifth charge generating layer 44E may each be a laminate of an electron accepting material and an electron donating material. In this case, when voltage is applied between the first electrode 41 and the second electrode 42, in an interface between the electron accepting material and the electron donating material, charges generated by reaction involving electron transfer between these electron accepting material and electron donating material move to the first electrode 41 side and the second electrode 42 side. In the organic EL element 40, holes are thereby injected into the fifth light emitting unit 43E located on the first electrode 41 side of the fifth charge generating layer 44E, the fourth light emitting unit 43D located on the first electrode 41 side of the fourth charge generating layer 44D, the third light emitting unit 43C located on the first electrode 41 side of the third charge generating layer 44C, the second light emitting unit 43B located on the first electrode 41 side of the second charge generating layer 44B, and the first light emitting unit 43A located on the first electrode 41 side of the first charge generating layer 44A. Moreover, in the organic EL element 40, electrons are injected into the sixth light emitting unit 43F located on the second electrode 42 side of the fifth charge generating layer 44E, the fifth light emitting unit 43E located on the second electrode 42 side of the fourth charge generating layer 44D, the third fourth light emitting unit 43D located on the second electrode 42 side of the third charge generating layer 44C, the third light emitting unit 43C located on the second electrode 42 side of the second charge generating layer 44B, and the second light emitting unit 43B located on the second electrode 42 side of the first charge generating layer 44A. Light can be thereby simultaneously emitted from the first light emitting unit 43A, the second light emitting unit 43B, the third light emitting unit 43C, the fourth light emitting unit 43D, the fifth light emitting unit 43E, and the sixth light emitting unit 43F with the same current amount. Accordingly, a current efficiency and an external quantum efficiency proportionate to the sum of luminous efficiencies of the first light emitting unit 43A, the second light emitting unit 43B, the third light emitting unit 43C, the fourth light emitting unit 43D, the fifth light emitting unit 43E, and the sixth light emitting unit 43F can be obtained.

As materials forming the first charge generating layer 44A, the second charge generating layer 44B, the third charge generating layer 44C, the fourth charge generating layer 44D, and the fifth charge generating layer 44E, the same materials as the materials forming the first charge generating layer 14A and the second charge generating layer 14B in the aforementioned first embodiment can be used.

The organic EL element 40 having the structure described above can provide white light by causing the first light emitting unit 43A, the second light emitting unit 43B, the third light emitting unit 43C, the fourth light emitting unit 43D, the fifth light emitting unit 43E, and the sixth light emitting unit 43F to emit light.

Moreover, the organic EL element 40 of the embodiment can provide white light with high color temperature, high luminous efficiency, and an excellent color rendering property as in the organic EL element 10 in the aforementioned first embodiment. Moreover, the organic EL element 40 of the embodiment has the MPE structure in which the first light emitting unit 43A, the second light emitting unit 43B, the third light emitting unit 43C, the fourth light emitting unit 43D, the fifth light emitting unit 43E, and the sixth light emitting unit 43F are stacked one on top of another with each of the first charge generating layer 44A, the second charge generating layer 44B, the third charge generating layer 44C, the fourth charge generating layer 44D, and the fifth charge generating layer 44E sandwiched between the corresponding pair of adjacent light emitting units. Accordingly, the organic EL element 40 can provide the white light while achieving high-luminance light emission and long-life driving.

The organic EL element 40 of the embodiment can be thus preferably used in both of a display device and a lighting device.

Fifth Embodiment

Figure 10:
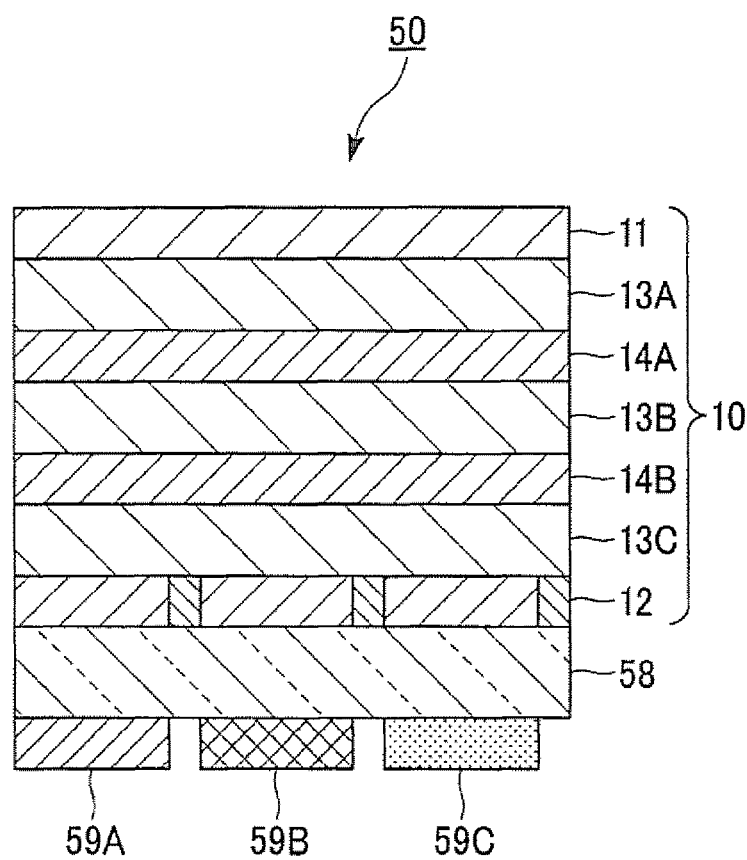
FIG. 10 is a cross-sectional view illustrating a schematic configuration of a fifth embodiment of the organic EL element in the present invention.

FIG. 10 is a cross-sectional view illustrating a schematic configuration of a fifth embodiment of the organic EL element in the present invention.

As illustrated in FIG. 10, the organic EL element 50 of the embodiment has a structure in which multiple organic EL elements 10 in the aforementioned first embodiment are provided side by side on a transparent substrate 58. In this configuration, the organic EL elements 10 are sectioned based on the respective second electrodes 12 provided on the transparent substrate 58 at certain intervals.

Each of the organic EL elements 10 forms a light emitting portion of the organic EL element 50 and three different color filters 59A, 59B, 59C of red, green, and blue are arranged in turn at positions corresponding to the respective light emitting portions with the transparent substrate 58 therebetween.

White light provided by each organic EL element 10 is converted to red light, green light, or blue light by one of the three different color filters 59A, 59B, 59C of red, green, and blue (red color filter 59A, green color filter 59B, or blue color filter 59C) and is emitted to the outside.

In the organic EL element 50 of the embodiment, it is thus possible to extract red light, green light, and blue light with high color purity based on white light with high color temperature, high luminous efficiency, and an excellent color rendering property.

An arrangement in which the red color filter 59A, the green color filter 59B, and the blue color filter 59C are arranged in turn forms an RGB arrangement. The RGB arrangement may be any arrangement selected from the group consisting of a stripe arrangement in which R, G, and B are arranged linearly, a mosaic arrangement in which R, G, and B are arranged diagonally, a delta arrangement in which R, G, and B are arranged in a triangular shape, and a pentile arrangement in which RG and GB are arranged alternately.

Image display with high resolution and natural color can be thereby achieved in a display device.

The organic EL element 50 of the embodiment can be thus preferably used in a display device.

Note that the organic EL element 50 of the embodiment is not necessarily limited to the aforementioned configuration and can be changed as appropriate. In the organic EL element 50 of the embodiment, the organic EL element 20 of the second embodiment, the organic EL element 30 of the third embodiment, or the organic EL element 40 of the fourth embodiment described above can be used instead of the organic EL element 10.

Moreover, the organic EL element 50 of the embodiment may have such a structure that the three different color filters of red, green, and blue are provided between the transparent substrate 58 and the second electrodes 12.

Sixth Embodiment

Figure 11:
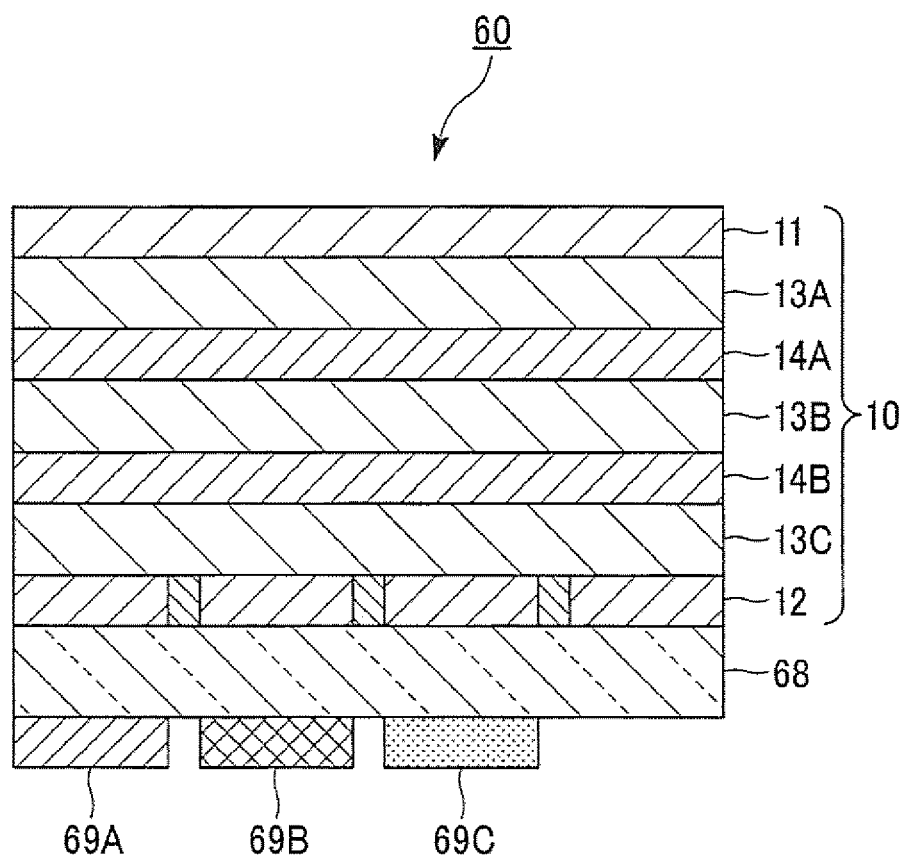
FIG. 11 is a cross-sectional view illustrating a schematic configuration of a sixth embodiment of the organic EL element in the present invention.

FIG. 11 is a cross-sectional view illustrating a schematic configuration of a sixth embodiment of the organic EL element in the present invention.

As illustrated in FIG. 11, the organic EL element 60 of the embodiment has a structure in which multiple organic EL elements 10 in the aforementioned first embodiment are provided side by side on a transparent substrate 68. In this configuration, the organic EL elements 10 are sectioned based on the respective second electrodes 12 provided on the transparent substrate 68 at certain intervals.

Each of the organic EL elements 10 forms a light emitting portion of the organic EL element 60 and three different color filters 69A, 69B, 69C of red, green, and blue and a no-color-filter portion are arranged in turn at positions corresponding to the respective light emitting portions with the transparent substrate 68 therebetween.

White light provided by each organic EL element 10 is converted to red light, green light, or blue light by one of the three different color filters 69A, 69B, 69C of red, green, and blue (red color filter 69A, green color filter 69B, or blue color filter 69C) and is emitted to the outside.

In the organic EL element 60 of the embodiment, it is thus possible to extract red light, green light, blue light with high color purity based on original white light with high color temperature, high luminous efficiency, and an excellent color rendering property.

Moreover, in the no-color-filter portion (portion where none of the red color filter 69A, green color filter 69B, and blue color filter 69C is provided on the transparent substrate 68 illustrated in FIG. 11), the white light provided by the organic EL element 10 is emitted to the outside as it is.

An arrangement in which the red color filter 69A, the green color filter 69B, and the blue color filter 69C are arranged in turn and the no-color-filter portion form an RGBW arrangement. The RGBW arrangement may be any arrangement selected from the group consisting of a stripe arrangement in which R, G, B, and W are arranged linearly, a mosaic arrangement in which R, G, B, and W are arranged diagonally, a delta arrangement in which R, G, B, and W are arranged in a triangular shape, and a pentile arrangement in which RG and BW are alternately arranged.

When white is displayed on a display, in the RGB method described in [0136], light of a white backlight is absorbed by the color filters of the respective colors upon passing the color filters and the luminance of the light is thereby reduced. Accordingly, the light amount of the backlight needs to be increased and this leads to an increase in the power consumption of the display.

Meanwhile, in the RGBW method, there is no color filter in the light emitting portion of W. Accordingly, when white is displayed, the light emission from the white backlight can be effectively used as it is. Hence, there is no decrease in luminance and an operation can be achieved with low power consumption.

Thus, low power consumption and image display with high resolution and natural color can be both achieved in a display device.

The organic EL element 60 of the embodiment can be thus preferably used in a display device.

Note that the organic EL element 60 of the embodiment is not necessarily limited to the aforementioned configuration and can be changed as appropriate. In the organic EL element 60 of the embodiment, the organic EL element 20 of the second embodiment, the organic EL element 30 of the third embodiment, or the organic EL element 40 of the fourth embodiment described above can be used instead of the organic EL element 10.

Moreover, the organic EL element 60 of the embodiment may have such a structure that the three different color filters of red, green, and blue are provided between the transparent substrate 68 and the second electrodes 12.

[Lighting Device]

An embodiment of the lighting device in the present invention is described.

Figure 12:
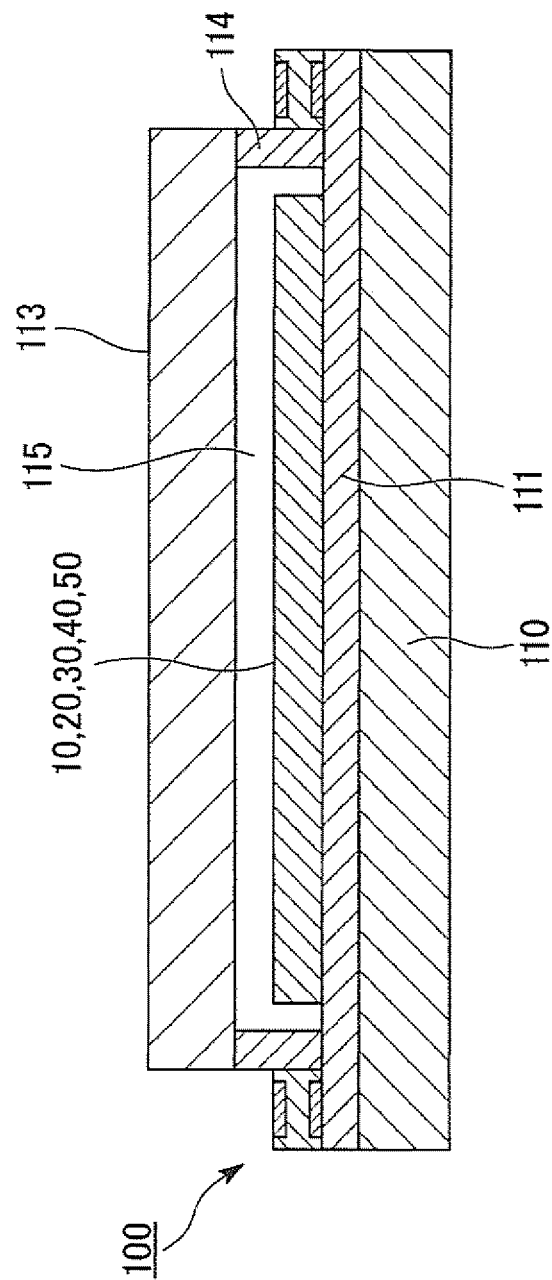
FIG. 12 is a cross-sectional view illustrating a schematic configuration of an embodiment of a lighting device in the present invention.

FIG. 12 is a cross-sectional view illustrating a configuration of the embodiment of the lighting device in the present invention. Although an example of the lighting device to which the present invention is applied is described herein, the lighting device of the present invention is not necessarily limited to such a configuration and various changes can be made as appropriate.

The lighting device 100 of the embodiment includes, for example, any one of the organic EL elements 10, 20, 30, 40, 50 as a light source.

As illustrated in FIG. 12, in the lighting device 100 of the embodiment, multiple anode terminal electrodes 111 and cathode terminal electrodes (illustration omitted) are formed at sides or vertices of a periphery of a glass substrate 110 so that the organic EL element 10, 20, 30, 40, 50 can uniformly emit light. Note that the entire surfaces of the anode terminal electrodes 111 and the entire surfaces of the cathode terminal electrodes are covered with solder (underlying solder) to reduce wiring resistance. Moreover, the anode terminal electrodes 111 and the cathode terminal electrodes uniformly supply an electric current to the organic EL element 10, 20, 30, 40, 50 from the sides or vertices of the periphery of the glass substrate 110. For example, in order to uniformly supply an electric current to the organic EL element 10, 20, 30, 40, 50 formed in a quadrilateral shape, the lighting device 100 includes the anode terminal electrodes 111 on the sides and the cathode terminal electrodes at the vertices. Alternatively, for example, the lighting device 100 includes the anode terminal electrodes 111 on peripheries of L-shaped portions each including a vertex and extending over two sides and the cathode terminal electrodes in center portions of the respective sides.

Moreover, a sealing substrate 113 is arranged on the glass substrate 110 to cover the organic EL element 10, 20, 30, 40, 50 to prevent degrading of the performance of the organic EL element 10, 20, 30, 40, 50 due to oxygen, water, and the like. The sealing substrate 113 is provided on the glass substrate 110 with a peripheral sealing member 114 therebetween. A small gap 115 is provided between the sealing substrate 113 and the organic EL element 10, 20, 30, 40, 50. This gap 115 is filled with a hygroscopic agent. The gap 115 may be filled with, for example, an inert gas such as nitrogen, silicone oil, or the like instead of the hygroscopic agent. Moreover, the gap 115 may be filled with a gel resin in which the hygroscopic agent is dispersed.

Note that, although the glass substrate 110 is used as a base substrate for forming the element in the embodiment, a substrate made of a material such as plastic, metal, or ceramic may also be used. Moreover, in the embodiment, a glass substrate, a plastic substrate, or the like can be used as the sealing substrate 113. When plastic substrates are used as the base substrate and the sealing substrate, the lighting device 100 of the embodiment is flexible.

Moreover, a UV curable resin or a thermal setting resin with low oxygen permeability and low water permeability, a laser glass frit, or the like can be used for the sealing member 114.

The lighting device of the embodiment may have a configuration including an optical film for improving the luminous efficiency, on the light extraction surface side of the organic EL element 10, 20, 30, 40, 50 in the aforementioned embodiment.

The optical film used in the lighting device of the embodiment is provided to improve the luminous efficiency while maintaining the color rendering property.

An organic EL element emits light in a light emitting layer with a higher refractive index (refractive index of about 1.6 to 2.1) than air and it is generally said that only about 15% to 20% of light emitted from the light emitting layer can be extracted. This is because light incident on an interface at an angle equal to or greater than a critical angle is totally reflected and cannot be extracted to the outside of the element. Specifically, light is totally reflected between a transparent substrate and a transparent electrode or the light emitting layer to be guided through the transparent electrode or the light emitting layer and resultantly escapes in directions toward side surfaces of the element.

As a method for improving the extraction efficiency of the light, there are, for example, the following methods: a method of making a surface of the transparent substrate rough to prevent total reflection on an interface between the transparent substrate and air (see, for example, "U.S. Pat. No. 4,774,435"); a method of providing the substrate with a light condensing property to improve the efficiency (see, for example, "Japanese Patent Application Publication No. Sho 63-314795"); a method of forming reflection surfaces on the side surfaces of the element and the like (see, for example, "Japanese Patent Application Publication No. Hei 1-220394"); a method of introducing a flat layer with an intermediate refractive index between the substrate and the light emitting body to form a reflection prevention film (see, for example, "Japanese Patent Application Publication No. Sho 62-172691"); a method of introducing a flat layer with a lower refractive index than the substrate, between the substrate and the light emitting body (see, for example, "Japanese Patent Application Publication No. 2001-202827"); a method of forming a diffraction grading between any two of the substrate, the transparent electrode layer, and the light emitting layer (including between the substrate and the outside) (see, for example, "Japanese Patent Application Publication No. Hei 11-283751"); and the like.

Note that, in order to improve the aforementioned color rendering property, the lighting device 100 may have a structure in which a microlens array or the like is further provided on a surface of the aforementioned optical film or may be combined with a light condensing sheet. This allows the light to be condensed in a specific direction, for example, a direction frontward of the element light emitting surface, thereby improving the luminance in the specific direction. Furthermore, a light diffusion film may be used together with the light condensing sheet to control a light emission angle from the organic EL element. For example, a light diffusion film (LIGHT-UP) manufactured by Kimoto Co., Ltd. or the like can be used as the light diffusion film.

Note that the present invention is not necessarily limited to the aforementioned embodiment and various changes can be made within a scope not departing from the spirit of the present invention.

Specifically, in the present invention, any of the organic EL elements 10, 20, 30, 40, 50 capable of providing the aforementioned white light can be preferably used as the light source of the lighting device 100 which is, for example, a general lighting device. Meanwhile, in the present invention, the organic EL elements 10, 20, 30, 40, 50 are not limited for use as the light source of the lighting device 100 and may be used in various applications such as, for example, a backlight of a liquid crystal display.

[Display Device]

An embodiment of the display device in the present invention is described.

Figure 13:
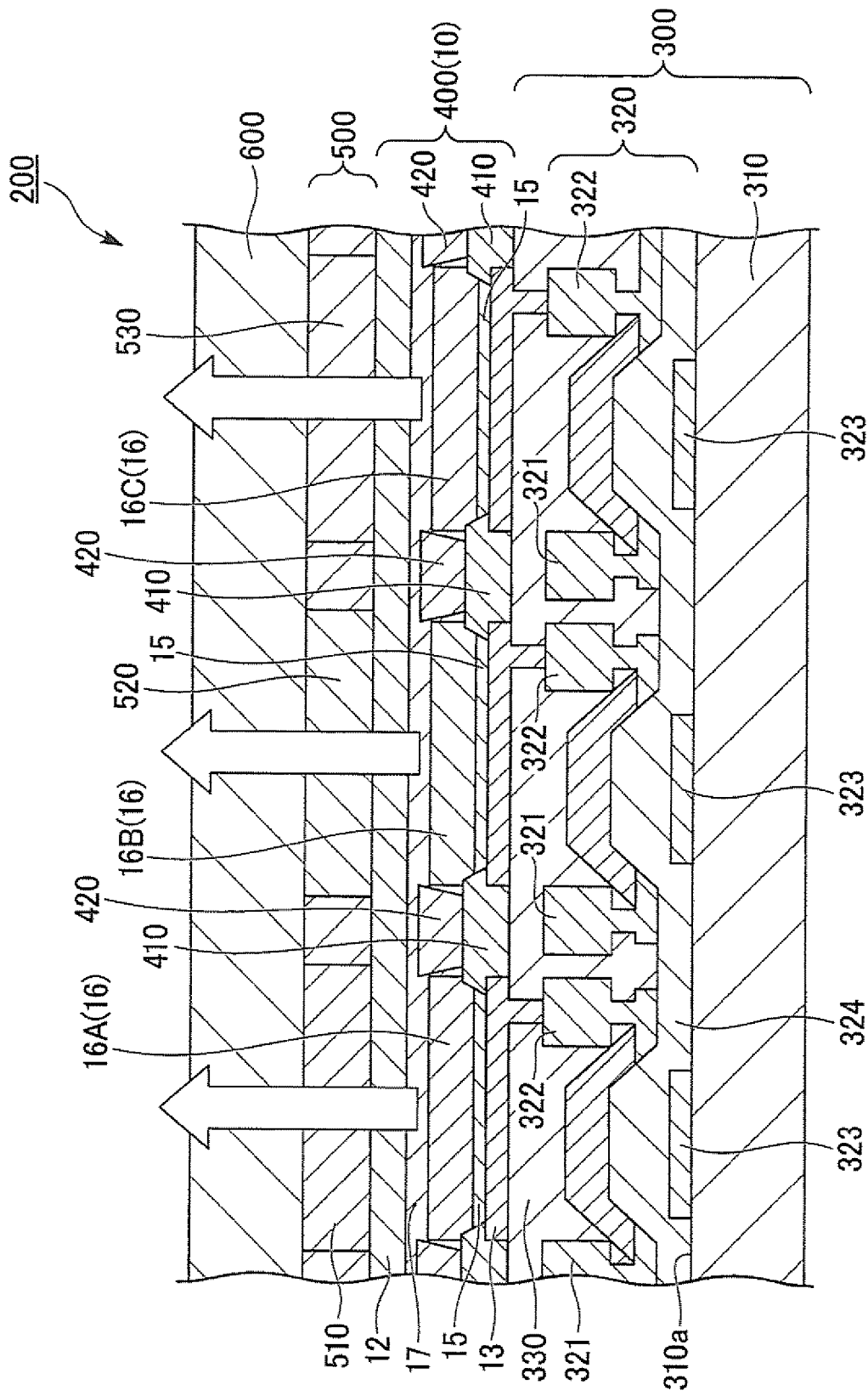
FIG. 13 is a cross-sectional view illustrating a schematic configuration of one embodiment of a display device in the present invention.

FIG. 13 is a cross-sectional view illustrating a configuration of the embodiment of the display device in the present invention. In FIG. 13, the same constitutional elements as those in the first embodiment of the organic EL element in the present invention illustrated in FIG. 1 and the fifth embodiment of the organic EL element in the present invention illustrated in FIG. 10 are denoted by the same reference numerals and description thereof is omitted. Moreover, although an example of the display device to which the present invention is applied is described herein, the display device of the present invention is not necessarily limited to such a configuration and changes can be made as appropriate.

The display device 200 of the embodiment includes, for example, the organic EL element 10 as the light source, the organic EL element 10 having a light emitting layer 16 including a first light emitting portion 16A, a second light emitting portion 16B, and a third light emitting portion 16C as described above.

The display device 200 of the embodiment is a top emission type and is an active matrix type.

As illustrated in FIG. 13, the display device 200 of the embodiment includes a TFT substrate 300, an organic EL element 400, a color filter 500, and a sealing substrate 600. In the display device 200 of the embodiment, the TFT substrate 300, the organic EL element 400, the color filter 500, and the sealing substrate 600 are stacked one on top of another in this order to form a laminated structure.

The TFT substrate 300 includes a base substrate 310, TFT elements 320 which are provided on one surface 310a of the base substrate 310, and an insulating layer 330 which is a planarization film layer (protection layer) provided on the one surface 310a of the base substrate 310 to cover the TFT elements 320.

A glass substrate, a flexible substrate made of plastic, and the like can be given as examples of the base substrate 310.

The TFT elements 320 each include a source electrode 321, a drain electrode 322, a gate electrode 323, a gate insulating layer 324 formed on the gate electrode 323, and a channel region provided on the gate insulating layer 324 and being in contact with the source electrode 321 and the drain electrode 322.

The organic EL element 400 has the same configuration as the organic EL element 10.

The light emitting layer 16 in the organic EL element 400 includes the first light emitting portion 16A which emits red light, the second light emitting portion 16B which emits green light, and the third light emitting portion 16C which emits blue light.

First partition walls (banks) 410 and second partition walls (ribs) 420 stacked thereon are provided between the first light emitting portion 16A and the second light emitting portion 16B, between the second light emitting portion 16B and the third light emitting portion 16C, and between the third light emitting portion 16C and the first light emitting portion 16A.

The first partition walls 410 are provided on the insulating layer 330. The first partition walls 410 have a shape tapered in a direction away from the insulating layer 330. The width of the first partition walls 410 gradually becomes smaller as the distance from the insulating layer 330 increases.

The second partition walls 420 are provided on the first partition walls 410. The second partition walls 420 have a shape reverse-tapered in a direction away from the first partition walls 410. The width of the second partition walls 420 gradually becomes greater as the distance from the first partition walls 410 increases.

The first partition walls 410 and the second partition walls 420 are made of an insulating material. A fluorine-containing resin can be given as an example of the material forming the first partition walls 410 and the second partition walls 420. Vinylidene fluoride, vinyl fluoride, trifluoroethylene, copolymers of these, and the like can be given as examples of a fluorine compound contained in the fluorine-containing resin. A phenol novolac resin, a polyvinyl phenol resin, an acrylic resin, a methacrylic resin, and combination of these can be given as examples of a resin contained in the fluorine-containing resin.

The first light emitting portion 16A, the second light emitting portion 16B, and the third light emitting portion 16C are provided on a second electrode 13 formed on the insulating layer 330 of the TFT elements 320, with a hole transport layer 15 provided between the insulating layer 330 and the light emitting portions 16A, 16B, 16C.

The second electrode 13 is connected to the drain electrodes 322 of the TFT elements 320.

The color filter 500 is provided on a first electrode 12 of the organic EL element 400.

The color filter 500 includes a first color filter 510 corresponding to the first light emitting portion 16A, a second color filter 520 corresponding to the second light emitting portion 16B, and a third color filter 530 corresponding to the third light emitting portion 16C.

The first color filter 510 is a red color filter and is arranged to face the first light emitting portion 16A.

The second color filter 520 is a green color filter and is arranged to face the second light emitting portion 16B.

The third color filter 530 is a blue color filter and is arranged to face the third light emitting portion 16C.

A glass substrate, a flexible substrate made of plastic, and the like can be given as examples of the sealing substrate 600. When plastic is used for the base substrate 310 and the sealing substrate 600, the display device 200 of the embodiment is flexible.

Note that, as illustrated in FIG. 13, although the example in which the light emitting layer 16 of the organic EL element 400 includes the first light emitting portion 16A which emits red light, the second light emitting portion 16B which emits green light, and the third light emitting portion 16C which emits blue light are described in the embodiment, the embodiment is not limited to this. The light emitting layer 16 may include the first light emitting portion 16A which emits red light, the second light emitting portion 16B which emits green light, the third light emitting portion 16C which emits blue light, and a fourth light emitting portion 16D which emits white light. Note that none of the color filters are disposed at a position corresponding to the fourth light emitting portion 16D.

The display device 200 of the embodiment can provide white light with high color temperature, high luminous efficiency, and an excellent color rendering property. Moreover, since the display device 200 of the embodiment includes the organic EL element 50 in the fifth embodiment, the display device 200 can provide white light whose correlated color temperature is 3300 or more, average color rendering index (Ra) is 70 or more, and R6 and R12 among the special color rendering indices (Ri) are 60 or more and 30 or more, respectively.

Note that the present invention is not necessarily limited to the aforementioned embodiment and various changes can be made within a scope not departing from the spirit of the present invention. In the display device 200 of the embodiment, the organic EL element 60 in the aforementioned sixth embodiment can be used instead of the organic EL element 50.

EXAMPLES

Effects of the present invention are made clearer below by using Examples.

Note that the present invention is not limited to following Examples and changes can be made as appropriate within a scope not departing from the spirit of the invention.

Example 1

"Manufacturing of Organic EL Element"

In Example 1, an organic EL element having an element structure illustrated in FIG. 14 was manufactured.

Specifically, first, there was prepared a soda-lime glass substrate with a thickness of 0.7 mm on which an ITO film with a thickness of 100 nm, a width of 2 mm, and a sheet resistance of about 20Ω/□ was formed.

Then, the substrate was subjected to ultrasonic cleaning by using neutral detergent, ion-exchanged water, acetone, and isopropyl alcohol for 5 minutes for each cleaner and then subjected to spin drying and UV/$O_3$ treatment.

Next, vapor deposition crucibles (made of tantalum or alumina) in a vacuum deposition apparatus were filled respectively with materials used to form layers illustrated in FIG. 14. Then, the substrate was set in the vacuum deposition apparatus, electric power was supplied to the vapor deposition crucibles to heat them in a reduced pressure atmosphere with a degree of vacuum of $1\times10^{-4}$ Pa or less, and each of the layers was vapor-deposited to a predetermined film thickness at a deposition rate of 0.1 nm per second. Moreover, each of the layers made of two or more materials such as the light emitting layers was formed by supplying power to the corresponding vapor deposition crucibles and performing co-deposition such that the layer was formed to have a predetermined mix ratio.

Moreover, the first electrode was vapor-deposited to a predetermined film thickness at a deposition rate of 1 nm per second.

"Evaluation of Organic EL Element"

The organic EL element of Example 1 manufactured as described above was connected to a power supply (KEITHLEY 2425) and power with a constant current of 3 mA/$cm^2$ was supplied to the organic EL element of Example 1 to cause it to emit light. An emission spectrum of light emitted from the organic EL element in the frontward direction in this case was measured by using a multichannel analyzer (trade name: PMA-11, manufactured by Hamamatsu Photonics K. K.).

Then, the emitted light color was evaluated based on the measurement result by using chromaticity coordinates in the CIE color system. Moreover, the emitted light color was classified into one of light source colors specified in "JIS Z 9112" based on the chromaticity coordinates. Furthermore, the deviation duv from a blackbody locus was derived based on the specifications of "JIS Z 8725." Moreover, the average color rendering index (Ra) of the emitted light color was derived by using the method specified in "JIS Z 8726." The results (no film) of these evaluations are collectively illustrated in FIG. 15.

Example 2

An organic EL element of Example 2 having an element structure illustrated in FIG. 16 was manufactured by using the same manufacturing method as that of Example 1.

Then, the organic EL element of Example 2 was evaluated in the same methods as those in Example 1. The evaluation results (no film) are illustrated in FIG. 17.

Figure 15:
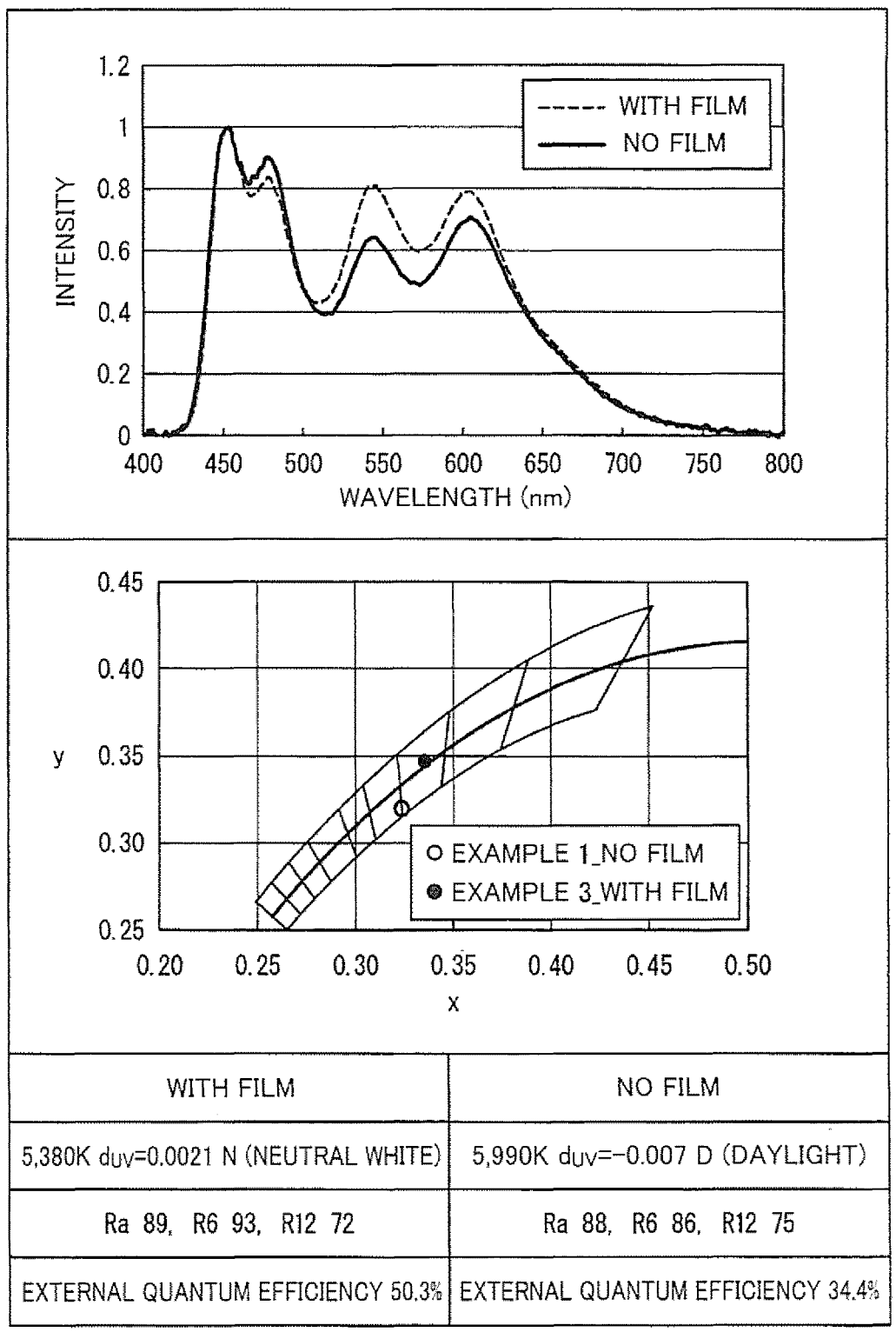
FIG. 15 is a view illustrating evaluation results of the organic EL element in Example 1.
Figure 17:
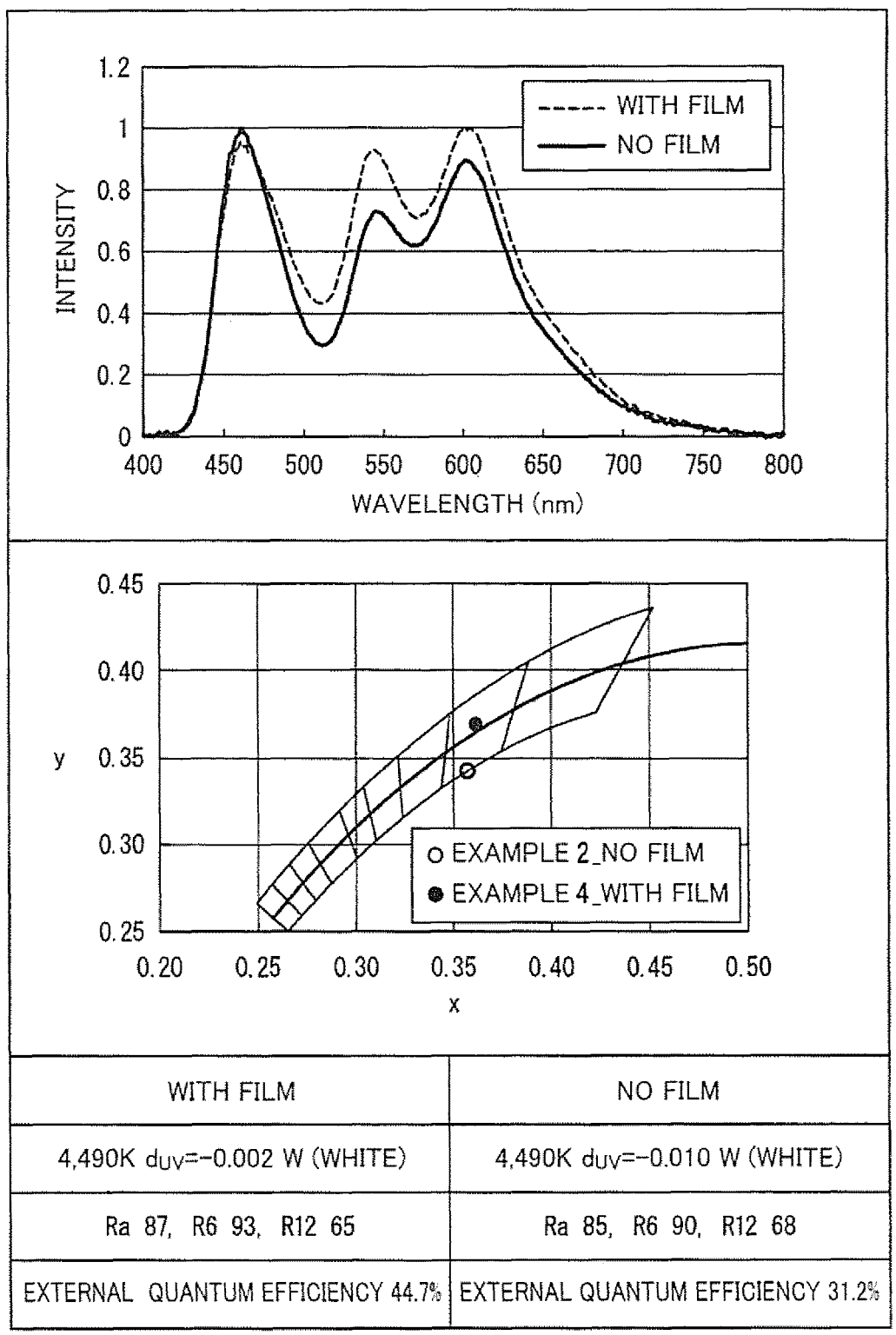
FIG. 17 is a view illustrating evaluation results of the organic EL element in Example 2.

As illustrated in FIGS. 15 and 17, the organic EL elements of Examples 1 and 2 both provided the white light with high color temperature, high luminous efficiency, and an excellent color rendering property. Accordingly, it was found that lighting devices and display devices including such an organic EL element can be lighting devices and display devices with high color temperature, high luminous efficiency, and an excellent color rendering property.

Example 3

An optical film was attached to the light extraction surface (second electrode) side of the organic EL element of the aforementioned Example 1 to manufacture a lighting device of Example 3.

Then, the lighting device of Example 3 was evaluated in the same methods as those in Example 1. The evaluation results (with film) are illustrated in FIG. 15.

Example 4

An optical film was attached to the light extraction surface (second electrode) side of the organic EL element of the aforementioned Example 2 to manufacture a lighting device of Example 4.

Then, the lighting device of Example 4 was evaluated in the same methods as those in Example 1. The evaluation results (with film) are illustrated in FIG. 17.

As illustrated in FIGS. 15 and 17, it was found that, in the lighting devices of Examples 3 and 4, attaching the optical film to the light extraction surface (second electrode) side of the organic EL element changed the shape of the emission spectrum from that in the case where no optical film was attached (illustrated by broken lines in FIGS. 15 and 17). Particularly, it was found that the light emission intensities of the two peak wavelengths appearing in the green wavelength band and the red wavelength band were increased as compared with those obtained without the films.

Thus, in the lighting devices of Examples 3 and 4, the luminous efficiency was greatly improved while maintaining the high color temperature and the excellent color rendering property of the organic EL elements in Examples 1 and 2. The luminous efficiency was improved to about 1.4 times the luminous efficiency of the organic EL element of Example 1 while maintaining high color temperature of 3300 K or more and an excellent color rendering property of Ra of 80 or more, R6 of 60 or more, and R12 of 30 or more.

INDUSTRIAL APPLICABILITY

One aspect described above can provide an organic electroluminescent element which can provide white light with high color temperature, high luminous efficiency, and an excellent color rendering property and is thus suitable for both of a display device and a lighting device and also provide a display device and a lighting device including this organic electroluminescent element.

DESCRIPTION OF REFERENCE NUMERALS 10, 20, 30, 40, 50, 60 organic EL element
11, 21, 31, 41, 51, 61 first electrode
12, 22, 32, 42, 52, 62 second electrode
13A, 23A, 33A, 43A, 53A, 63A first light emitting unit 13B, 23B, 33B, 43B, 53B, 63B second light emitting unit
33C, 43C third light emitting unit
33D, 43D fourth light emitting unit
43E fifth light emitting unit
43F sixth light emitting unit
14A, 24A, 34A, 44A, 54A, 64A first charge generating layer
14B, 24B, 34B, 44B, 54B, 64B second charge generating layer
15A, 25A, 35A, 45A first electron transport layer
16A, 26A, 36A, 46A first light emitting layer
17A, 27A, 37A, 47A first hole transport layer
15B, 25B, 35B, 45B second electron transport layer
16B, 26B, 36B, 46B second light emitting layer
17B, 27B, 37B, 47B second hole transport layer
15C, 25C, 35C, 45C third electron transport layer
16C, 26C, 36C, 46C third light emitting layer
17C, 27C, 37C, 47C third hole transport layer
35D, 45D fourth electron transport layer
36D, 46D fourth light emitting layer
37D, 47D fourth hole transport layer
45E fifth electron transport layer
46E fifth light emitting layer
47E fifth hole transport layer
45F sixth electron transport layer
46F sixth light emitting layer
47F sixth hole transport layer
100 lighting device
111 anode terminal electrode
113 sealing substrate
114 sealing member
115 gap
200 display device
300 TFT substrate
310 base substrate
320 TFT element
321 source electrode
322 drain electrode
323 gate electrode
324 gate insulating layer
330 insulating layer
400 organic EL element
410 first partition wall
420 second partition wall
500 color filter
510 first color filter
520 second color filter
530 third color filter
600 sealing substrate

The invention claimed is:

1. An organic electroluminescent element having a structure in which a plurality of light emitting units each including a light emitting layer made of at least an organic compound are stacked one on top of another between a first electrode and a second electrode with a charge generating layer sandwiched between each pair of adjacent light emitting units, wherein
the organic electroluminescent element comprises
at least two blue light emitting units each including a light emitting layer formed of a blue light emitting layer which emits blue light with one or two peak wavelengths in a blue wavelength band, and
one of a red/green emitting unit including a light emitting layer formed by stacking a red phosphorescent light emitting layer which emits red light with one peak wavelength in a red wavelength band and a green phosphorescent light emitting layer which emits green light with one peak wavelength in a green wavelength band one on top of the other, and a red-green light emitting unit including a light emitting layer formed of a mixed layer of a red phosphorescent material and a green phosphorescent material,
a light emission intensity of a peak wavelength in a green wavelength band is lower than a light emission intensity of a peak wavelength in a red wavelength band,
white light produced by light emission of the plurality of light emitting units has an emission spectrum continuous over a wavelength band of at least 380 nm to 780 nm and has one or two peak wavelengths in a blue wavelength band of 440 nm to 490 nm in the emission spectrum,
correlated color temperature of the white light is 3300 K or higher, and
R6 and R12 among special color rendering indices (Ri) of the white light are 60 or more and 30 or more, respectively.

2. The organic electroluminescent element according to claim 1, wherein characterized in that R12 among the special color rendering indices (Ri) of the white light is 60 or more.

3. The organic electroluminescent element according to claim 1, wherein each blue light emitting layer is formed of a blue fluorescent light emitting layer containing a blue fluorescent material.

4. The organic electroluminescent element according to claim 3, wherein the blue light provided by each of the blue light emitting units including the blue fluorescent light emitting layer includes a delayed fluorescence component.

5. The organic electroluminescent element according to claim 1, wherein the blue light emitting layer is formed of a blue phosphorescent light emitting layer containing a blue phosphorescent material.

6. The organic electroluminescent element according to claim 1, wherein
the at least two blue light emitting units comprise two blue light emitting units which are both identical and which emit blue light with the same peak wavelength.

7. The organic electroluminescent element according to claim 1, wherein
the at least two blue light emitting units comprise two blue light emitting units which are both different from each other and which emit blue light with different peak wavelengths from each other.

8. The organic electroluminescent element according to claim 7, wherein the white light has one peak wavelength in a blue wavelength band of 440 nm to 470 nm and one peak wavelength in a blue wavelength band of 470 nm to 490 nm.

9. The organic electroluminescent element according to claim 1, wherein
the white light produced by the light emission of the plurality of light emitting units has one peak wavelength in the red wavelength band of 590 nm to 640 nm and one or two peak wavelengths in the green wavelength band of 500 nm to 560 nm.

10. The organic electroluminescent element according to claim 9, the organic electroluminescent element capable of providing the white light by causing the plurality of light emitting units to emit light, wherein
the organic electroluminescent element comprises:
a first light emitting unit;
a second light emitting unit; and
a third light emitting unit formed of one of the at least two blue light emitting units, the first light emitting unit and the second light emitting unit are stacked one on top of the other with a first charge generating layer sandwiched therebetween, the second light emitting unit and the third light emitting unit are stacked one on top of the other with a second charge generating layer sandwiched therebetween, and the organic electroluminescent element has a structure in which the second electrode, the third light emitting unit, the second charge generating layer, the second light emitting unit, the first charge generating layer, the first light emitting unit, and the first electrode are stacked one on top of another in this order, when the first light emitting unit is the at least one red/green light emitting unit or the at least one red-green light emitting unit, the second light emitting unit is one of the at least two blue light emitting units, and when the first light emitting unit is one of the at least two blue light emitting units, the second light emitting unit is the at least one red/green light emitting unit or the at least one red-green light emitting unit.

11. The organic electroluminescent element according to claim 9, the organic electroluminescent element capable of providing the white light by causing the plurality of light emitting units to emit light, wherein
the organic electroluminescent element comprises:
a first light emitting unit formed of the red/green light emitting unit or the at least one red-green light emitting unit;
a second light emitting unit formed of the at least two blue light emitting units;
a third light emitting unit formed of the at least one red/green light emitting unit or the at least one red-green light emitting unit; and
a fourth light emitting unit formed of the at least two blue light emitting units, the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween,
the third light emitting unit and the fourth light emitting unit are stacked one on top of the other with a third charge generating layer sandwiched therebetween, and
the organic electroluminescent element has a structure in which the second electrode, the fourth light emitting unit, the third charge generating layer, the third light emitting unit, the second charge generating layer, the second light emitting unit, the first charge generating layer, the first light emitting unit, and the first electrode are stacked one on top of another in this order.

12. The organic electroluminescent element according to claim 9, the organic electroluminescent element capable of providing the white light by causing the plurality of light emitting units to emit light, wherein
the organic electroluminescent element comprises:
a first light emitting unit formed of the at least one red/green light emitting unit or the at least one red-green light emitting unit;
a second light emitting unit formed of the at least two blue light emitting units;
a third light emitting unit formed of the at least one red/green light emitting unit or the at least one red-green light emitting unit;
a fourth light emitting unit formed of the at least one red/green light emitting unit or the at least one red-green light emitting unit;
a fifth light emitting unit formed of the at least two blue light emitting units; and
a sixth light emitting unit formed of the at least one red/green light emitting unit or the at least one red-green light emitting unit,
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween,
the third light emitting unit and the fourth light emitting unit are stacked one on top of the other with a third charge generating layer sandwiched therebetween,
the fourth light emitting unit and the fifth light emitting unit are stacked one on top of the other with a fourth charge generating layer sandwiched therebetween,
the fifth light emitting unit and the sixth light emitting unit are stacked one on top of the other with a fifth charge generating layer sandwiched therebetween, and
the organic electroluminescent element has a structure in which the second electrode, the sixth light emitting unit, the fifth charge generating layer, the fifth light emitting unit, the fourth charge generating layer, the fourth light emitting unit, the third charge generating layer, the third light emitting unit, the second charge generating layer, the second light emitting unit, the first charge generating layer, the first light emitting unit, and the first electrode are stacked one on top of another in this order.

13. The organic electroluminescent element according to claim 1, wherein the white light further comprises a light emission intensity of the one or two peak wavelengths in the blue wavelength band of 440 nm to 490 nm such that the light emission intensity of the one or two peak wavelength in the blue wavelength band is higher than either of a light emission intensity of a peak wavelength in a red wavelength band of 590 nm to 640 nm and a light emission intensity of a peak wavelength in a green wavelength band of 500 nm to 560 nm in the wavelength band of the white light.

14. The organic electroluminescent element according to claim 13, wherein the white light has one bottom wavelength in a blue wavelength band and a green wavelength band of 500 nm to 520 nm.

15. The organic electroluminescent element according to claim 14, wherein a light emission intensity of the one bottom wavelength in the blue wavelength band and the green wavelength band of 500 nm to 520 nm is lower than a light emission intensity of a bottom wavelength in a wavelength band of 570 nm to 590 nm.

16. The organic electroluminescent element according to claim 14, wherein a ratio of (B) to (A) ((B)/(A)) is 0.50 or smaller, where (A) is a light emission intensity of a peak wavelength having the highest light emission intensity in the wavelength band of 380 nm to 780 nm and (B) is a light emission intensity of the one bottom wavelength in the blue wavelength band and the green wavelength band of 500 nm to 520 nm.

17. The organic electroluminescent element according to claim 1, wherein characterized in that an average color rendering index (Ra) of the white light is 70 or more.

18. The organic electroluminescent element according to claim 1, wherein the charge generating layers are formed of electrically insulating layers made of an electron accepting material and an electron donating material, and a specific resistance of the electrically insulating layers is $1.0 \times 10^2 \Omega \cdot cm$ or more.

19. The organic electroluminescent element according to claim 18, wherein characterized in that the specific resistance of the electrically insulating layers is $1.0 \times 10^2 \Omega \cdot cm$ or more.

20. The organic electroluminescent element according to claim 1, wherein each of the charge generating layers is formed of a mixed layer of different materials and one component of the mixed layer forms a charge transfer complex by redox, and when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

21. The organic electroluminescent element according to claim 1, wherein each of the charge generating layers is formed of a laminate of an electron accepting material and an electron donating material, and when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

22. The organic electroluminescent element according to claim 1, wherein the charge generating layers contain a compound having a structure expressed by formula (1):

[Chem. 1]

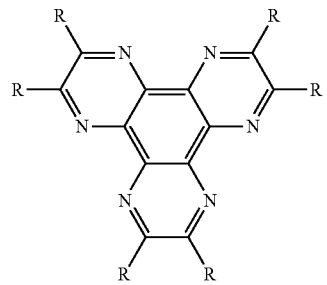
(1)

where R represents an electron withdrawing group of F, Cl, Br, I, CN, or $CF_3$.

23. The organic electroluminescent element according to claim 1, wherein the organic electroluminescent element comprises at least three color filters different from one another, and an arrangement of the at least three color filters different from one another changes the white light produced by the light emission of the plurality of light emitting units to light of a different color.

24. The organic electroluminescent element according to claim 23, wherein the arrangement of the at least three color filters different from one another is one selected from the group consisting of a stripe arrangement, a mosaic arrangement, a delta arrangement, and a pentile arrangement.

25. The organic electroluminescent element according to claim 23, wherein the at least three color filters different from one another are a red color filter, a green color filter, and a blue color filter, and the organic electroluminescent element has a RGB arrangement in which the three color filters different from one another are arranged in turn.

26. The organic electroluminescent element according to claim 25, wherein the organic electroluminescent element has a RGBW arrangement including the RGB arrangement, and the color filters are not arranged in an arrangement portion of W.

27. The organic electroluminescent element according to claim 26, wherein the RGBW arrangement is one selected from the group consisting of a stripe arrangement, a mosaic arrangement, a delta arrangement, and a pentile arrangement.

28. A display device, comprising:
the organic electroluminescent element according to claim 23.

29. The display device according to claim 28, wherein
the display device comprises a base substrate and a sealing substrate which are formed of flexible substrates, and
the display device is flexible.

30. A lighting device, comprising:
the organic electroluminescent element according to claim 1.

31. The lighting device according to claim 30, wherein the lighting device comprises an optical film on a light extraction surface side of the organic electroluminescent element.

32. The lighting device according to claim 30, wherein an average color rendering index (Ra) of the white light is 80 or more.

33. The lighting device according to claim 30, wherein
the lighting device comprises a base substrate and a sealing substrate which are formed of flexible substrates, and
the lighting device is flexible.

* * * * *